(12) United States Patent
Nishimura et al.

(10) Patent No.: US 9,502,592 B2
(45) Date of Patent: Nov. 22, 2016

(54) FILM-FORMING COMPOSITION

(75) Inventors: Naoya Nishimura, Funabashi (JP);
Taku Kato, Funabashi (JP); Yasuyuki Koide, Funabashi (JP); Kei Yasui, Funabashi (JP); Hideki Musashi, Funabashi (JP); Masaaki Ozawa, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 13/882,925

(22) PCT Filed: Oct. 28, 2011

(86) PCT No.: PCT/JP2011/074909
§ 371 (c)(1),
(2), (4) Date: Jul. 12, 2013

(87) PCT Pub. No.: WO2012/060286
PCT Pub. Date: May 10, 2012

(65) Prior Publication Data
US 2013/0281620 A1 Oct. 24, 2013

(30) Foreign Application Priority Data

Nov. 2, 2010 (JP) ................................. 2010-246166

(51) Int. Cl.
C08G 67/02 (2006.01)
H01L 31/0232 (2014.01)
C08G 73/00 (2006.01)
C08G 73/02 (2006.01)
C08G 73/06 (2006.01)
C08L 79/02 (2006.01)
C08L 79/04 (2006.01)
C09D 179/02 (2006.01)
C09D 179/04 (2006.01)
H01L 31/0216 (2014.01)
C08K 5/00 (2006.01)
C08K 5/09 (2006.01)
C08K 5/16 (2006.01)

(52) U.S. Cl.
CPC ....... H01L 31/0232 (2013.01); C08G 73/0273 (2013.01); C08G 73/0644 (2013.01); C08L 79/02 (2013.01); C08L 79/04 (2013.01); C09D 179/02 (2013.01); C09D 179/04 (2013.01); H01L 31/02168 (2013.01); H01L 31/02327 (2013.01); C08K 5/0008 (2013.01); C08K 5/09 (2013.01); C08K 5/16 (2013.01); Y02E 10/50 (2013.01)

(58) Field of Classification Search
None
See application file for complete search history.

(56) References Cited

U.S. PATENT DOCUMENTS

| 5,886,130 | A | 3/1999 | Trimmer et al. |
| 7,588,659 | B2 | 9/2009 | Yoshino et al. |
| 8,618,243 | B2 * | 12/2013 | Nishimura et al. ........... 528/422 |
| 2006/0084788 | A1 | 4/2006 | Yoshino et al. |
| 2009/0318725 | A1 | 12/2009 | Takeuchi |
| 2012/0049308 | A1 | 3/2012 | Nishimura et al. |

FOREIGN PATENT DOCUMENTS

| CN | 101717396 | * | 6/2010 |
| EP | 0 925 319 | * | 6/1999 |
| EP | 0 925 319 B1 | | 12/2001 |
| JP | 7-113009 A | | 5/1957 |
| JP | 32-3145 | | 5/1957 |
| JP | 10-287745 A | | 10/1998 |
| JP | 2000-53659 A | | 2/2000 |
| JP | 2004-156001 A | | 6/2004 |
| JP | 2004-231942 A | | 8/2004 |
| JP | 2007-246877 A | | 9/2007 |
| JP | 2008-24832 A | | 2/2008 |

(Continued)

OTHER PUBLICATIONS

Mahapatra et al., Poly. Degrad. And Stab. 92 (2007) 947-955.*

(Continued)

Primary Examiner — Susannah Chung
Assistant Examiner — Robert T Butcher
(74) Attorney, Agent, or Firm — Birch, Stewart, Kolasch & Birch, LLP

(57) ABSTRACT

A film-forming composition is characterized by containing: a triazine ring-containing hyperbranched polymer containing a repeating unit structure represented by formula (1); and a dissolution-enhancing agent for breaking a hydrogen bond formed at least within the hyperbranched polymer and/or between molecules, between a nitrogen atom in the triazine ring, and a diarylamine-derived NH group. The film-forming composition has excellent dissolvability in organic solvents such as resist solvents, and has good handling and filtration properties at low viscosity.

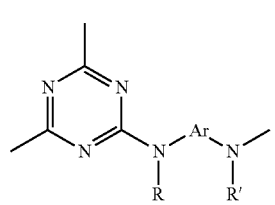

(1)

(In the formula, R and R' each independently represent a hydrogen atom, an alkyl group, an alkoxy group, an aryl group, or an aralkyl group (however, at least one of R and R' represents a hydrogen atom); and Ar represents a divalent organic group containing an aromatic ring and/or a heterocyclic ring).

19 Claims, 2 Drawing Sheets

(56) References Cited

FOREIGN PATENT DOCUMENTS

| | | |
|---|---|---|
| JP | 4246619 B2 | 11/2010 |
| WO | WO 2010/128660 A1 | 11/2010 |
| WO | WO 2010/128660 A1 * | 11/2010 |
| WO | WO 2010/128661 A1 | 11/2010 |

OTHER PUBLICATIONS

Mahapatra et al., Polym. J., 41, No. 1,20-25, (2009).*
Mahapatra et al, J. Appl. Poly. Sci., vol. 106, 95-102 (2007).*
Machine Translation of An et al. CN 101717396 A, pp. 1-8.*
Translation of EP 0 925 319, Jun. 1999, Thelakkat et al., p. 1-46.*
Mahapatra et al., "Effect of Structure and Concentration of Polymer, Metal Ion, and pH of the Medium on the Fluorescence Characteristics of Hyperbranched Polyamines", Journal of Luminescence, 128, 2008, pp. 1917-1921.
Mahapatra et al., "Fluorescent Hyperbranched Polyamine with s-Triazine: Synthesis, Characterization and Properties Evaluation", Polymer Journal, vol. 41, No. 1, pp. 20-25, 2009.
Search Report dated Apr. 4, 2014 for European Application No. 11837936.
Takagi et al., "Triazine Dendrimes by Divergent and Convergent Methods", Journal of Polymer Science: Part A: Polymer Chemistry, vol. 38, pp. 4385-4395, 2000.
Wen et al., "Hyperbranched Triazine-Containing Polyfluorenes: Efficient Blue Emitters for Polymer Light-Emitting Diodes (PLEDs)", Polymer, 48, 2007, pp. 1824-1829.
Zhang et al., "Structure-Activity Realtionships in Dendrimers Based on Triazines: Gelation Depends on Choice of Linking and Surface Groups", Macromolecules 2002, 35, pp. 9015-9021.
International Search Report for PCT/JP2011/074909 dated Jan. 24, 2012.
Mahapatra et al., "Hyperbranched Aromatic Polyamines with s-Triazine Rings", Journal of Applied Polymer Science, vol. 106, 2007, pp. 95-102.

* cited by examiner

FILM-FORMING COMPOSITION

TECHNICAL FIELD

The present invention relates to a film-forming composition, and more particularly to a film-forming composition which includes a triazine ring-containing hyperbranched polymer and a dissolution promoter.

BACKGROUND ART

Various efforts have hitherto been made to increase the functionality of polymeric compounds. For example, in one approach currently used to increase the refractive index of polymeric compounds, aromatic rings, halogen atoms or sulfur atoms are introduced onto the compound. Of such compounds, episulfide polymeric compounds and thiourethane polymeric compounds, both of which have sulfur atoms introduced thereon, are in practical use today as high-refractive index lenses for eyeglasses.

However, given that material design to a refractive index above 1.7 is difficult with a polymer alone, the most effective method for achieving an even higher refractive index is known to involve the use of inorganic metal oxides.

For example, a method for increasing the refractive index by using a hybrid material composed of a siloxane polymer mixed with a material containing small dispersed particles of zirconia, titania or the like has been disclosed (Patent Document 1).

A method in which a condensed ring skeleton having a high refractive index is introduced onto portions of a siloxane polymer has also been disclosed (Patent Document 2).

In addition, numerous attempts have been made to impart heat resistance to polymeric compounds. Specifically, it is well known that the heat resistance of polymeric compounds can be improved by introducing aromatic rings. For example, polyarylene copolymers with substituted arylene recurring units on the backbone have been disclosed (Patent Document 3). Such polymeric compounds show promise primarily in use as heat-resistant plastics.

Melamine resins are familiar as triazine resins, but have a very low decomposition temperature compared with heat-resistant materials such as graphite.

The heat-resistant organic materials composed of carbon and nitrogen that have been in use up until now are for the most part aromatic polyimides and aromatic polyamides. However, because these materials have straight-chain structures, their heat-resistance temperatures have not been all that high.

Triazine-based condensation materials have also been reported as nitrogen-containing polymeric materials having heat resistance (Patent Document 4).

In recent years, there has arisen a need for high-performance polymeric materials in the development of electronic devices such as liquid-crystal displays, organic electroluminescent (EL) displays, optical semiconductor (LED) devices, solid-state image sensors, organic thin-film solar cells, dye-sensitized solar cells and organic thin-film transistors (TFT).

The specific properties desired in such polymeric materials include (1) heat resistance, (2) transparency, (3) high refractive index, (4) high solubility, and (5) low volume shrinkage.

However, because the high refractive index lens materials for eyeglasses mentioned above generally have a poor heat resistance, requiring that production be carried out in a temperature range no higher than 200° C., materials of this type are unsuitable for processes such as baking in open air at 300° C.

Moreover, because polymeric compounds in which aromatic rings or triazine rings have been introduced generally have an inadequate solubility in solvents, they are insoluble in resist solvents which are safe solvents. On the other hand, materials which exhibit a high solubility generally have a low transparency.

In materials that use inorganic metal oxides, there is a trade-off between refractive index and transparency, which makes it difficult to increase the transparency while retaining a high refractive index.

Moreover, given that this material contains fine particles of differing characteristics, in the course of a dry process such as etching or ashing, the etch rate becomes unstable, making a film of uniform thickness difficult to obtain, and also resulting in a narrower process margin during device fabrication.

Highly branched polymers are broadly divided into hyperbranched polymers and dendrimers.

As used herein, "hyperbranched polymer" refers to a highly branched polymer with an irregular branched structure that is obtained by, for example, polymerizing ABx-type polyfunctional monomers (where A and B represent functional groups that react with each other, and "x" on B is a number equal to 2 or more).

"Dendrimer" refers to a highly branched polymer which has a regular branched structure. Hyperbranched polymers are characterized by being easier to synthesize than dendrimers, and by the ease with which high-molecular-weight bodies can be synthesized.

It has been reported that triazine ring-containing hyperbranched polymers have been synthesized for flame retardant applications (Non-Patent Document 1).

PRIOR ART DOCUMENTS

Patent Documents

Patent Document 1: JP-A 2007-246877
Patent Document 2: JP-A 2008-24832
Patent Document 3: U.S. Pat. No. 5,886,130
Patent Document 4: JP-A 2000-53659
Patent Document 5: JP No. 4246619

Non-Patent Documents

Non-Patent Document 1: *Journal of Applied Polymer Science*, 106, 95-102 (2007)

SUMMARY OF THE INVENTION

Problems to be Solved by the Invention

It is therefore an object of the present invention to provide a film-forming composition which includes a triazine ring-containing hyperbranched polymer, has an excellent solubility in organic solvents such as resist solvents, has a low viscosity and thus good handleability and filterability, and does not readily give rise to foreign matter following filtration.

Means for Solving the Problems

The inventors earlier discovered that hyperbranched polymers containing recurring units with a triazine ring and an aromatic ring have a refractive index greater than 1.7 and are able, with the polymer alone, to achieve a high heat resistance, high transparency, high refractive index, high solubility and low volume shrinkage, and are thus suitable as film-forming compositions in the fabrication of electronic devices (International Application PCT/JP 2010/057761).

Although such triazine ring-containing hyperbranched polymers are generally polymers which are capable of dissolving in common resist solvents and the like, it has been found that, depending on the structure of these polymers, various problems sometimes arise. For example, (1) dissolution may take time, (2) the viscosity may increase, resulting in a poor handleability, (3) the filterability may decrease, and (4) foreign matter may arise after filtration.

The inventors, suspecting that the above problems may be caused by the tendency of triazine ring-containing hyperbranched polymers to form intermolecular N—H . . . N hydrogen bonds, have conducted further investigations. As a result, they have discovered that by adding to this hyperbranched polymer a compound capable of breaking hydrogen bonds, dissolution of the polymer is promoted, enabling the various above problems to be resolved, and that compositions containing such ingredients are even better suited for use as film-forming compositions in the fabrication of electronic devices.

In the technical field of biopolymers, adenine and thymine form the intermolecular hydrogen bonds N—H . . . O=C and N—H . . . N, and guanine and cytosine form the intermolecular hydrogen bonds C=O . . . H—N, N—H . . . N and N—H . . . O=C. However, it is known that even these strong hydrogen bonds undergo recombination under the influence of added substances such as water, acids and urea, and can be broken.

A method for joining polyamide that makes use of a technique for breaking these hydrogen bonds has been reported (Patent Document 5), and it has been noted that a strong junction can be achieved by breaking hydrogen bonds. However, nothing has previously been mentioned concerning the fact that compounds including both triazine rings and amino groups such as are used in this invention have the various above-described problems, and the fact that such problems can be resolved by adding a dissolution promoter having a hydrogen bond breaking action.

Accordingly, the invention provides:
1. A film-forming composition containing a triazine ring-containing hyperbranched polymer which includes a recurring unit structure of formula (1) below

[Chemical Formula 1]

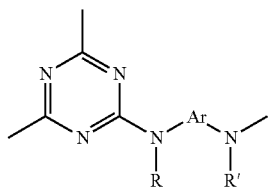
(1)

(wherein R and R' are each independently a hydrogen atom, an alkyl group, an alkoxy group, an aryl group or an aralkyl group, with the proviso that at least one of R and R' is a hydrogen atom; and Ar is a divalent organic group which includes one or both of an aromatic ring and a heterocycle), and at least a dissolution promoter which breaks hydrogen bonds that have formed, within and/or between molecules of the hyperbranched polymer, between nitrogen atoms on the triazine ring and NH groups from a diarylamine;

2. The film-forming composition according to 1 above, wherein Ar is at least one selected from the group consisting of formulas (2) to (18) below

[Chemical Formula 2]

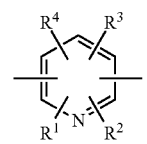
(2)

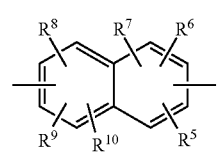
(3)

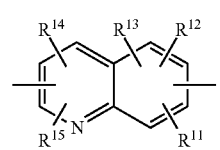
(4)

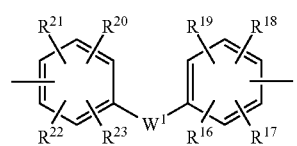
(5)

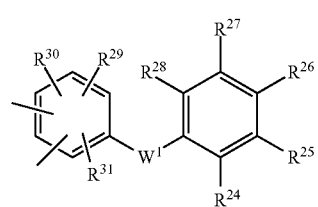
(6)

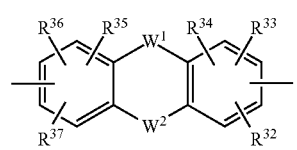
(7)

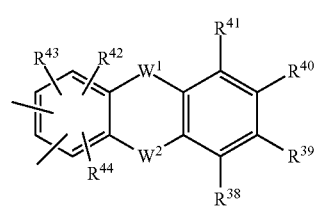
(8)

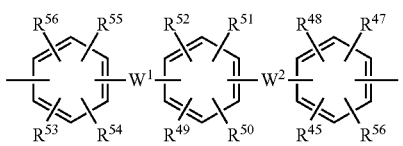
(9)

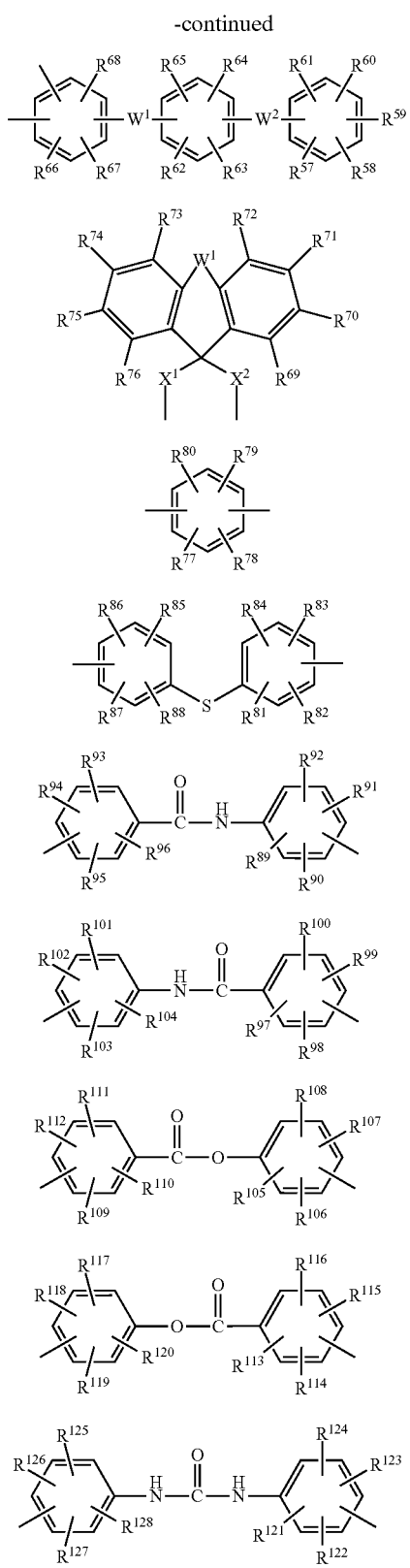

(wherein $R^1$ to $R^{128}$ are each independently a hydrogen atom, a halogen atom, a carboxyl group, a sulfonyl group, an alkyl group which may have a branched structure of 1 to 10 carbons, or an alkoxy group which may have a branched structure of 1 to 10 carbons; $W^1$ and $W^2$ are each independently a single bond, $CR^{129}R^{130}$ ($R^{129}$ and $R^{130}$ being each independently a hydrogen atom or an alkyl group which may have a branched structure of 1 to 10 carbons, with the proviso that $R^{129}$ and $R^{130}$ may together form a ring), C=O, O, S, SO, $SO_2$ or $NR^{131}$ ($R^{131}$ being a hydrogen atom or an alkyl group which may have a branched structure of 1 to 10 carbons); and $X^1$ and $X^2$ are each independently a single bond, an alkylene group which may have a branched structure of 1 to 10 carbons, or a group of formula (19) below

[Chemical Formula 3]

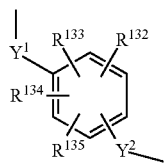

($R^{132}$ to $R^{135}$ being each independently a hydrogen atom, a halogen atom, a carboxyl group, a sulfonyl group, an alkyl group which may have a branched structure of 1 to 10 carbons, or an alkoxy group which may have a branched structure of 1 to 10 carbons; and $Y^1$ and $Y^2$ being each independently a single bond or an alkylene group which may have a branched structure of 1 to 10 carbons));

3. The film-forming composition according to 2 above, wherein Ar is at least one selected from the group consisting of formulas (5) to (12) and formulas (14) to (18);

4. The film-forming composition according to 2 above, wherein Ar is at least one selected from the group consisting of formulas (20) to (22) below

[Chemical Formula 4]

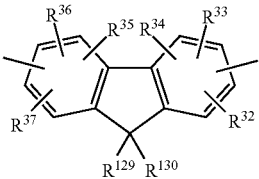

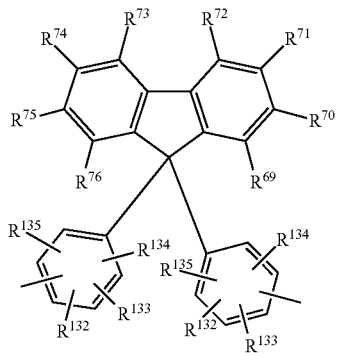

-continued

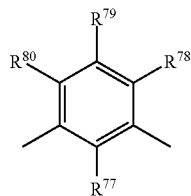
(22)

($R^{32}$ to $R^{37}$, $R^{69}$ to $R^{80}$, $R^{129}$, $R^{130}$ and $R^{132}$ to $R^{135}$ being as defined above);

5. The film-forming composition according to 1 above, wherein the recurring unit structure has formula (23) below

[Chemical Formula 5]

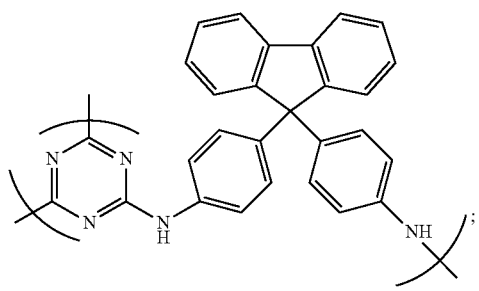
(23)

6. The film-forming composition according to 1 above, wherein the recurring unit structure has formula (24) below

[Chemical Formula 6]

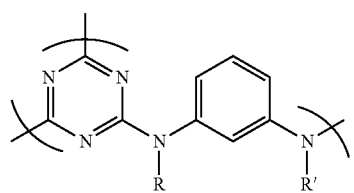
(24)

(R and R' being as defined above);

7. The film-forming composition according to 6 above, wherein the recurring unit structure has formula (25) below

[Chemical Formula 7]

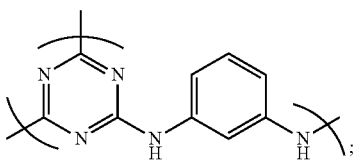
(25)

8. The film-forming composition according to any one of 1 to 7 above, wherein the triazine ring-containing hyperbranched polymer is capped on at least one end by an alkyl, aralkyl, aryl, alkylamino, alkoxysilyl-containing alkylamino, aralkylamino, arylamino, alkoxy, aralkyloxy, aryloxy or ester group;

9. The film-forming composition according to 8 above, wherein the triazine ring-containing hyperbranched polymer has at least one terminal triazine ring, which terminal triazine ring is capped by an alkyl, aralkyl, aryl, alkylamino, alkoxysilyl-containing alkylamino, aralkylamino, arylamino, alkoxy, aralkyloxy, aryloxy or ester group;

10. The film-forming composition according to any one of 1 to 9 above, wherein the dissolution promoter is a compound which includes one or more type of group selected from among hydroxyl, carbonyl, carboxyl, amino and amide groups and urethane and urea bonds;

11. The film-forming composition according to any one of 1 to 9 above, wherein the dissolution promoter is water;

12. The film-forming composition according to any one of 1 to 9 above, wherein the dissolution promoter is an acid;

13. The film-forming composition according to any one of 1 to 9 above, wherein the dissolution promoter is a base;

14. A film obtained from the film-forming composition of any one of 1 to 13 above;

15. An electronic device having a base material and the film of 14 above formed on the base material;

16. An optical member having a base material and the film of 14 above formed on the base material;

17. A solid-state image sensor formed of a charge-coupled device or a complementary metal oxide semiconductor, the sensor having at least one layer of the film of 14 above;

18. A solid-state image sensor having, as a planarization layer on a color filter, the film of 14 above; and 19. A lens material, planarizing material or embedding material for a solid-state image sensor, the material being made of the film-forming composition of any one of 1 to 13 above.

Advantageous Effects of the Invention

This invention is able to provide a film-forming composition containing a triazine ring-containing polymer and a dissolution promoter, which composition rapidly dissolves in various organic solvents such as resist solvents, has a low viscosity and thus is endowed with a good handleability and a good filterability, and does not give rise to foreign matter following filtration.

By employing the above polymer skeleton, a high heat resistance and a high transparency can be maintained even in cases where (1) a secondary amine is used as a polymer spacer, and (2) a primary amine is substituted at the chain ends. Hence, even in cases where monomer units hitherto thought to invite a loss of heat resistance and transparency are used, there is a possibility that the physical properties can be controlled by merely changing the polymer skeleton to a hyperbranched structure.

The reason why the hyperbranched polymer used in this invention manifests a high refractive index is thought to be due to the fact that, because the polymer has a hyperbranched structure, the triazine rings and aryl (Ar) moieties gather together closely, elevating the electron density. In particular, it is thought that when R and/or R' above are hydrogen atoms, owing to the hyperbranched structure of the polymer, the nitrogen atoms on the triazine rings and hydrogen atoms at amine sites form hydrogen bonds, causing the triazine rings and aryl (Ar) moieties to cluster together even more closely and further increasing the electron density.

Hence, even polymers which do not have sulfur atoms on the molecule exhibit high refractive indices (as measured at a wavelength of 550 nm) of 1.70 or more.

The range in this refractive index varies also with the particular application, although the lower limit value is preferably at least 1.70, more preferably at least 1.75, and even more preferably at least 1.80. The upper limit value is typically not more than about 2.00 to 1.95.

Triazine ring-containing hyperbranched polymers exhibit a high refractive index, yet undergo intermolecular hydrogen bonding between nitrogen atoms on the triazine rings and hydrogen atoms at amine sites. If these bonding forces are large, various problems sometimes arise when the polymer is dissolved in a resist solvent. For example, (1) dissolution may take time, (2) the viscosity may increase, resulting in a poor handleability, (3) the filterability may decrease, and (4) due to recombination and reformation of the hydrogen bonds, foreign matter may arise following filtration. These problems can be resolved by adding a dissolution promoter.

Once these problems are resolved, the handleability of the polymer and the polymer-containing composition increases, the filtration time shortens and, because foreign matter does not arise following filtration, the varnish production time can be shortened, enabling a wider production margin to be achieved. Moreover, varnish can be stably prepared, thus making it possible to stably maintain the quality of varnish that has been produced. In addition, because the storage stability of the produced varnish increases and foreign matter does not arise, the film formability at the time of film deposition on a desired substrate is stable and the film quality and in-plane uniformity improve, making it possible to increase the process margin for electronic devices that are fabricated. Because defects such as foreign matter are reduced in the electronic devices thus fabricated, a higher yield, lower production costs and an increased production speed can be achieved.

Moreover, because the triazine ring-containing polymer of the invention is able by itself, without including a metal oxide, to exhibit a high refractive index, even in the course of a dry process such as etching or ashing, the etch rate is constant, enabling a film of uniform thickness to be obtained, and thus widening the process margin during device fabrication.

The physical properties of the triazine ring-containing hyperbranched polymer used in the invention can be controlled by varying the types of monomers serving as the starting material at the time of synthesis.

Films produced using the inventive film-forming composition which includes a triazine ring-containing hyperbranched polymer and a dissolution promoter and has characteristics such as the above can be advantageously used as components in the fabrication of electronic devices such as liquid-crystal displays, organic electroluminescent (EL) displays, optical semiconductor (LED) devices, solid-state image sensors, organic thin-film solar cells, dye-sensitized solar cells and organic thin-film transistors (TFT). Such films can also be advantageously used as lens components which are required to have a high refractive index. In particular, such films can be advantageously used as the following solid-state image sensor components which are required to have especially high refractive indices: embedding films and planarizing films on photodiodes, planarizing films before and after color filters, microlenses, planarizing films on microlenses, and conformal films.

BRIEF DESCRIPTION OF THE DIAGRAMS

EMBODIMENT FOR CARRYING OUT THE INVENTION

Figure 1:
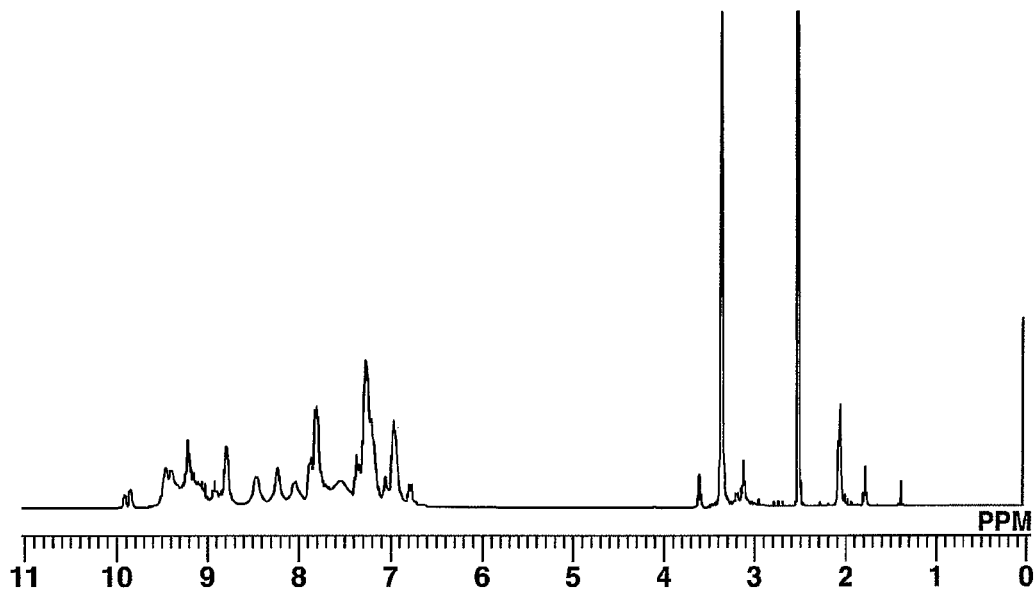
FIG. 1 is an $^1$H-NMR spectrum of the hyperbranched polymer [3] obtained in Synthesis Example 1.

The invention is described more fully below.

The film-forming composition according to the present invention includes a triazine ring-containing hyperbranched polymer which contains recurring unit structures of formula (1) below, and at least a dissolution promoter which breaks hydrogen bonds that have formed, within and/or between molecules of the hyperbranched polymer, between nitrogen atoms on the triazine ring and NH groups from a diarylamine.

[Chemical Formula 8]

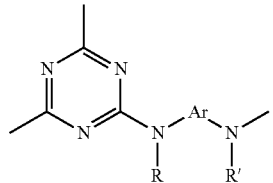

(1)

In the above formula, R and R' are each independently a hydrogen atom or an alkyl, alkoxy, aryl or aralkyl group.

In the invention, the number of carbons on the alkyl group, although not particularly limited, is preferably from 1 to 20. From the standpoint of further increasing the heat resistance of the polymer, the number of carbons is more preferably from 1 to 10, and even more preferably from 1 to 3. The alkyl group may have a linear, branched or cyclic structure.

Illustrative examples of alkyl groups include methyl, ethyl, n-propyl, isopropyl, cyclopropyl, n-butyl, isobutyl, s-butyl, t-butyl, cyclobutyl, 1-methylcyclopropyl, 2-methylcyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methylcyclobutyl, 2-methylcyclobutyl, 3-methylcyclobutyl, 1,2-dimethylcyclopropyl, 2,3-dimethylcyclopropyl, 1-ethylcyclopropyl, 2-ethylcyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methylcyclopentyl, 2-methylcyclopentyl, 3-methylcyclopentyl, 1-ethylcyclobutyl, 2-ethylcyclobutyl, 3-ethylcyclobutyl, 1,2-dimethylcyclobutyl, 1,3-dimethylcyclobutyl, 2,2-dimethylcyclobutyl, 2,3-dimethylcyclobutyl, 2,4-dimethylcyclobutyl, 3,3-dimethylcyclobutyl, 1-n-propylcyclopropyl, 2-n-propylcyclopropyl, 1-isopropylcyclopropyl, 2-isopropylcyclopropyl, 1,2,2-trimethylcyclopropyl, 1,2,3-trimethylcyclopropyl, 2,2,3-trimethylcyclopropyl, 1-ethyl-2-methylcyclopropyl, 2-ethyl-1-methylcyclopropyl, 2-ethyl-2-methylcyclopropyl and 2-ethyl-3-methylcyclopropyl.

The number of carbons on the alkoxy group, although not particularly limited, is preferably from 1 to 20. From the standpoint of further increasing the heat resistance of the polymer, the number of carbons is more preferably from 1 to 10, and even more preferably from 1 to 3. The alkyl moiety thereon may have a linear, branched or cyclic structure.

Illustrative examples of alkoxy groups include methoxy, ethoxy, n-propoxy, isopropoxy, n-butoxy, isobutoxy, s-butoxy, t-butoxy, n-pentoxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy and 1-ethyl-2-methyl-n-propoxy.

The number of carbons on the aryl group, although not particularly limited, is preferably from 6 to 40. From the standpoint of further increasing the heat resistance of the polymer, the number of carbons is more preferably from 6 to 16, and even more preferably from 6 to 13.

Illustrative examples of aryl groups include phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3-phenanthryl, 4-phenanthryl and 9-phenanthryl.

The number of carbons on the aralkyl group, although not particularly limited, is preferably from 7 to 20. The alkyl moiety thereon may be linear, branched or cyclic.

Illustrative examples of aralkyl groups include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphthylmethyl.

In above formula (1), Ar is a divalent organic group which includes either of, or both, an aromatic ring and a heterocycle, and is not otherwise limited. In the present invention, Ar is preferably at least one from among those of formulas (2) to (18) below, more preferably at least one from among those of formulas (5) to (18), and even more preferably at least one from among those of formulas (5), (7), (8), (11), (12) and (14) to (18).

[Chemical Formula 9]

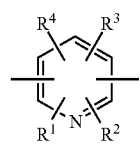
(2)

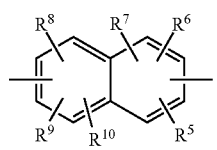
(3)

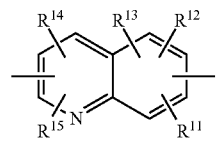
(4)

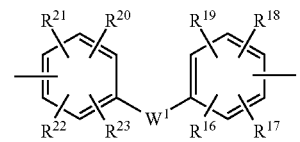
(5)

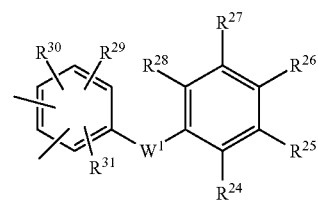
(6)

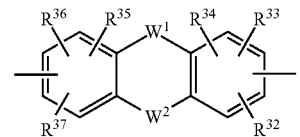
(7)

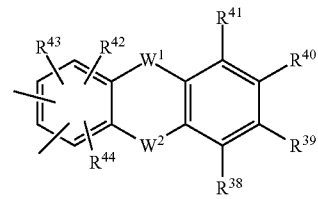
(8)

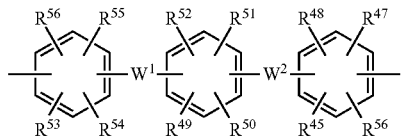
(9)

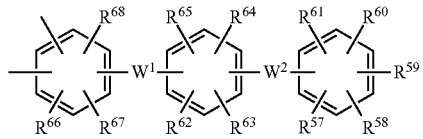
(10)

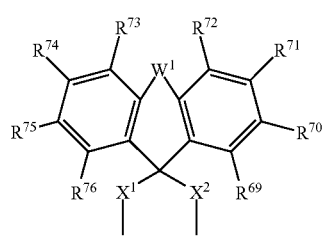
(11)

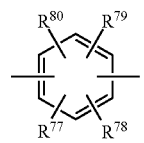
(12)

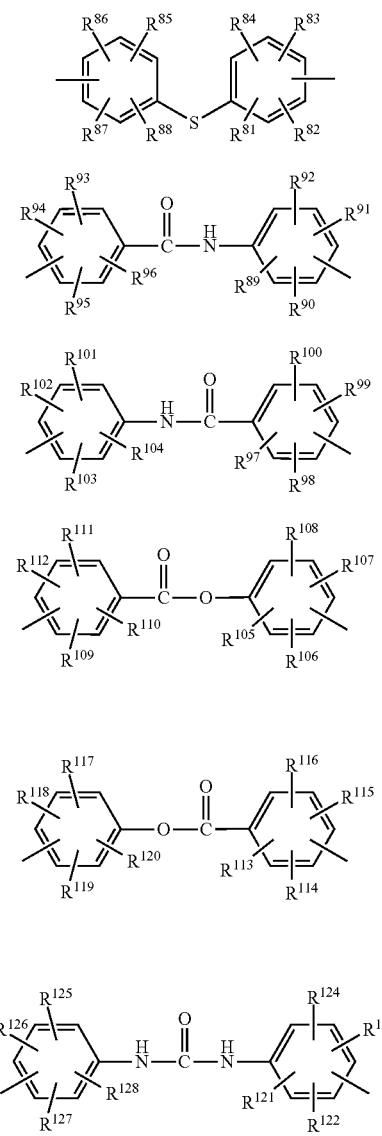

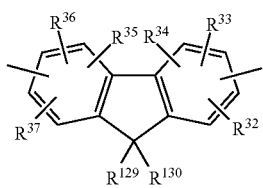

In the above formula, $R^{132}$ to $R^{135}$ are each independently a hydrogen atom, a halogen atom, a carboxyl group, a sulfonyl group, an alkyl group which may have a branched structure of 1 to 10 carbons, or an alkoxy structure which may have a branched structure of 1 to 10 carbons. $Y^1$ and $Y^2$ are each independently a single bond or an alkylene group which may have a branched structure of 1 to 10 carbons.

These halogen atoms, alkyl groups and alkoxy groups are exemplified by the same groups as mentioned above.

Illustrative examples of the alkylene group which may have a branched structure of 1 to 10 carbons include methylene, ethylene, propylene, trimethylene, tetramethylene and pentamethylene.

Preferred examples of Ar in the present invention include divalent organic groups having a fluorene ring. For example, divalent organic groups of formulas (20) and (21) below are preferred.

[Chemical Formula 11]

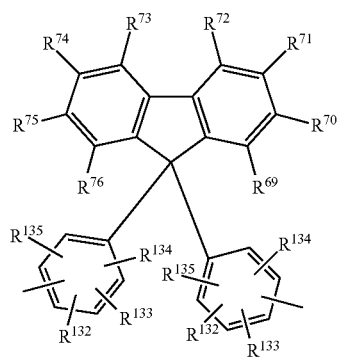

In the above formulas, $R^1$ to $R^{128}$ are each independently a hydrogen atom, a halogen atom, a carboxyl group, a sulfonyl group, an alkyl group which may have a branched structure of 1 to 10 carbons, or an alkoxy group which may have a branched structure of 1 to 10 carbons. $W^1$ and $W^2$ are each independently a single bond, $CR^{129}R^{130}$ (wherein $R^{129}$ and $R^{130}$ are each independently a hydrogen atom or an alkyl group which may have a branched structure of 1 to 10 carbons, with the proviso that $R^{129}$ and $R^{130}$ may together form a ring), C=O, O, S, SO, $SO_2$ or $NR^{131}$ (wherein $R^{131}$ is a hydrogen atom or an alkyl group which may have a branched structure of 1 to 10 carbons).

These alkyl groups and alkoxy groups are exemplified by the same groups as mentioned above.

Examples of the halogen atom include fluorine, chlorine, bromine and iodine.

$X^1$ and $X^2$ are each independently a single bond, an alkylene group which may have a branched structure of 1 to 10 carbons, or a group of formula (19) below.

In the above formulas, $R^{32}$ to $R^{37}$, $R^{69}$ to $R^{76}$, $R^{129}$, $R^{130}$ and $R^{132}$ to $R^{135}$ are each as defined above, although all are preferably hydrogen atoms.

Illustrative examples of the aryl groups of above formulas (2) to (18) include, but are not limited to, the following.
[Chemical Formula 12]
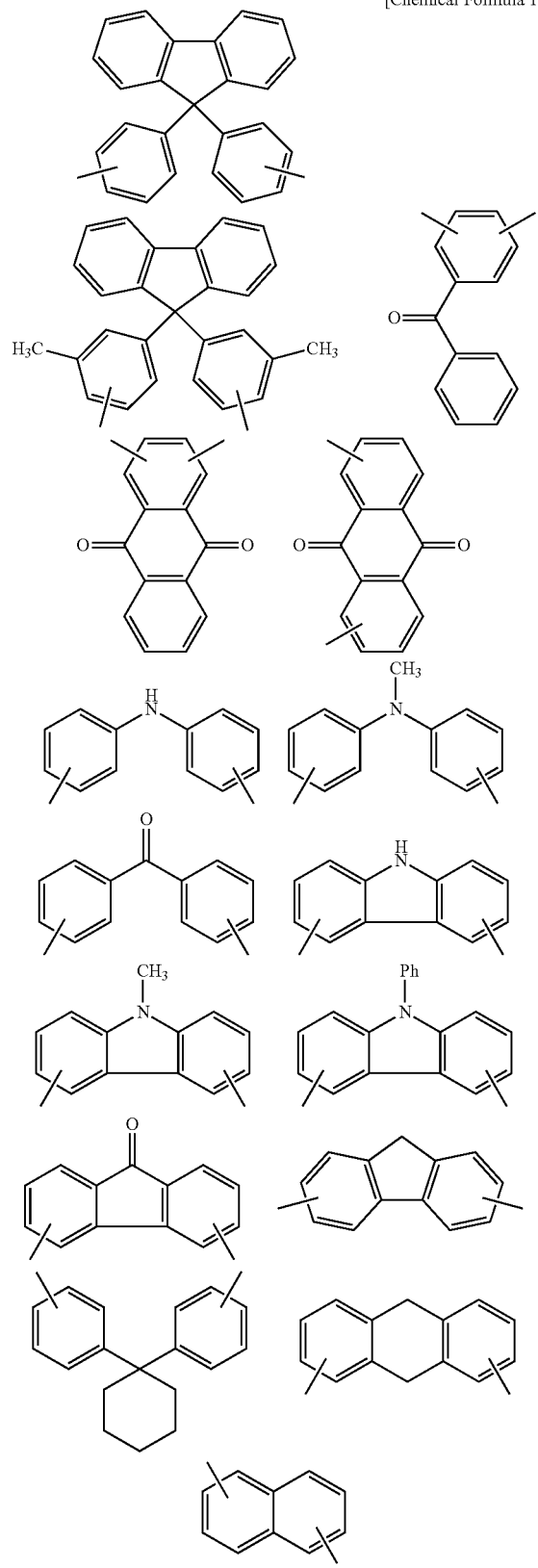
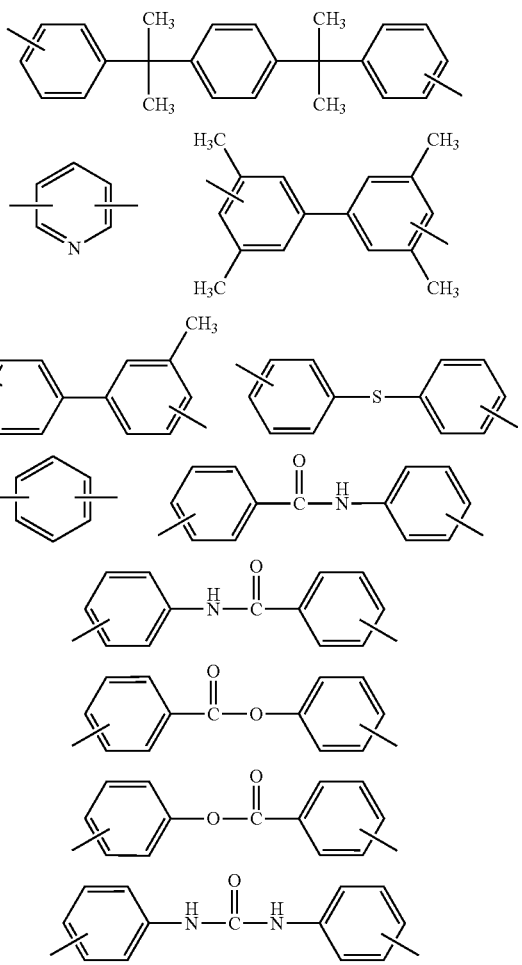
Of these, to obtain a polymer having a higher refractive index, the aryl groups of the following formulas are more preferred.
[Chemical Formula 13]
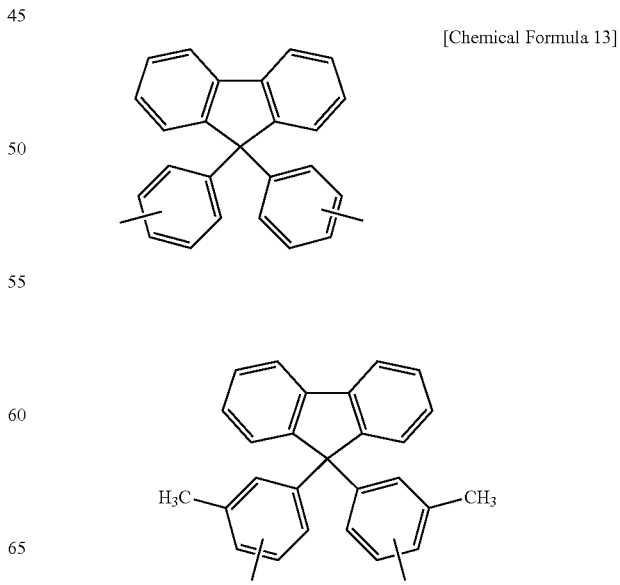

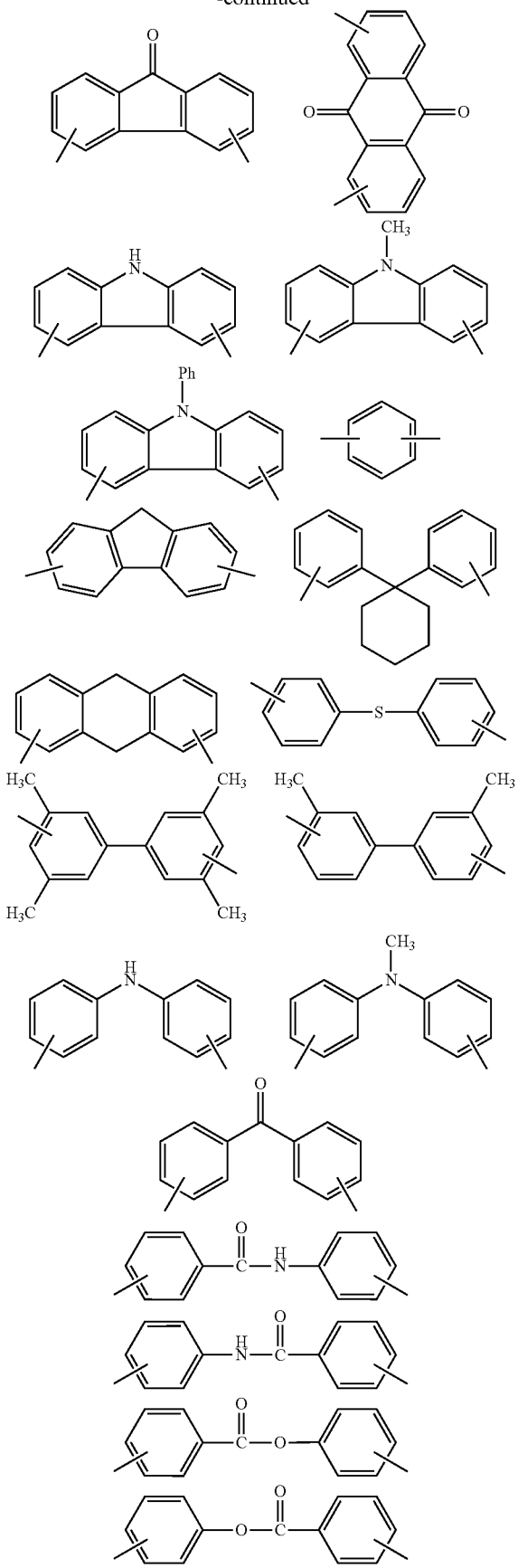

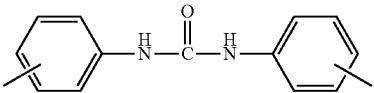

Moreover, from the standpoint of achieving a high refractive index, an aryl (Ar) moiety with a rigid structure having a cyclic skeleton such as a fluorene skeleton or a carbazole skeleton is preferable because the aryl (Ar) moieties tend to cluster together, increasing the electron density. Alternatively, a simple benzene ring is also preferable because, being small structures, aryl (Ar) moieties tend to cluster together, increasing the electron density.

As for benzene ring linkages such as $W^1$, functional groups having a high hydrogen bonding ability, such as carbonyl-containing groups and amines are preferred because these form hydrogen bonds with hydrogen atoms at amine sites (in cases where R and/or R' are hydrogen atoms), as a result of which the aryl (Ar) moieties tend to cluster together, increasing the electron density.

From the above standpoint, aryl groups of the following formulas are preferred.

[Chemical Formula 14]

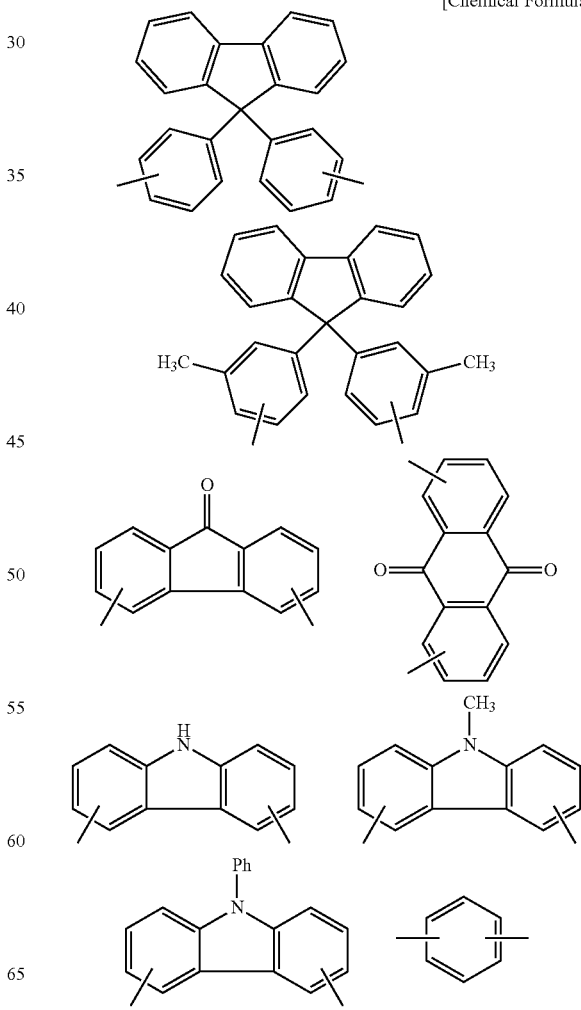

-continued

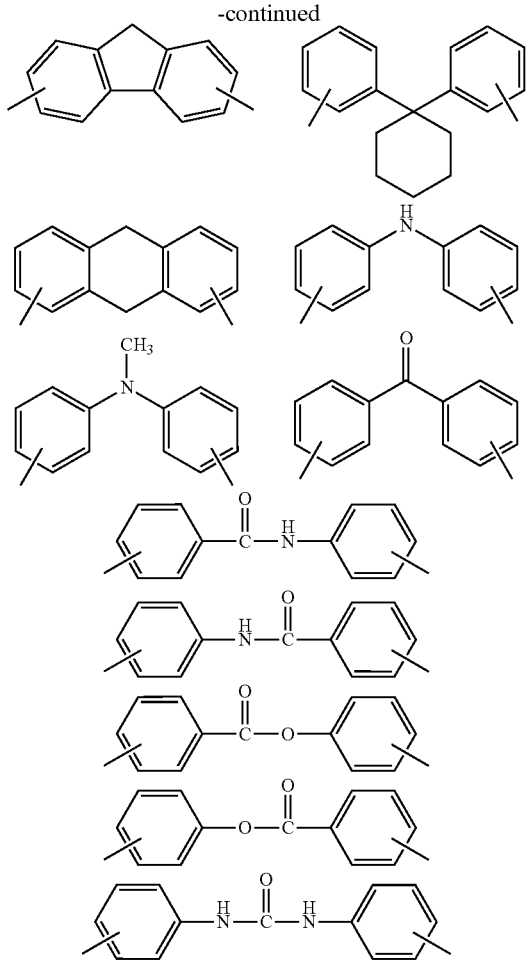

To achieve an even higher refractive index, aryl groups of the following formulas are more preferred.

[Chemical Formula 15]

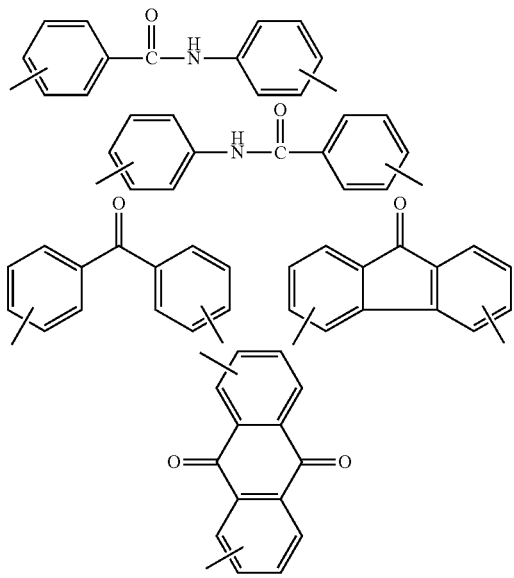

Examples of preferred recurring unit structures include, but are not limited to, those of formula (23) below.

[Chemical Formula 16]

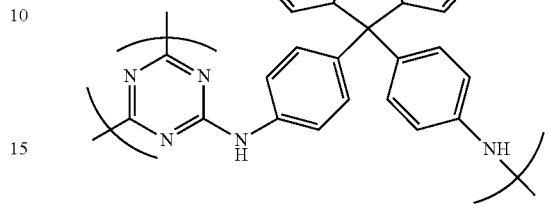

(23)

To further increase the solubility of the hyperbranched polymer in highly safe solvents such as resist solvents, an m-phenylenediamine derivative group of formula (22) below is preferred as the Ar group.

[Chemical Formula 17]

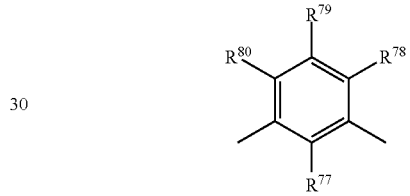

(22)

In the above formula, $R^{77}$ to $R^{80}$ are as defined above, although all are preferably hydrogen atoms.

Therefore, preferred recurring unit structures which give the polymer a good solubility include those of formula (24) below. In particular, hyperbranched polymers having recurring unit structures of formula (25) below in which R and R' are both hydrogen atoms are best.

[Chemical Formula 18]

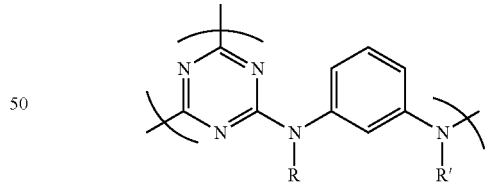

(24)

In the above formula, R and R' are as defined above.

[Chemical Formula 19]

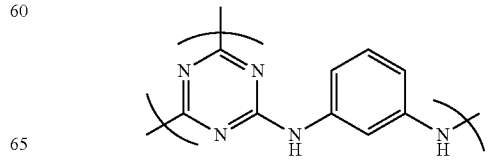

(25)

The hyperbranched polymer used in the present invention has a weight-average molecular weight which, although not particularly limited, is preferably between 500 and 500,000, and more preferably between 500 and 100,000. To further enhance the heat resistance and lower the shrinkage ratio, the weight-average molecular weight is preferably at least 2,000. To further increase the solubility and lower the viscosity of the resulting solution, the weight-average molecular weight is preferably 50,000 or less, more preferably 30,000 or less, and even more preferably 10,000 or less.

The weight-average molecular weight in the invention is the weight-average molecular weight measured by gel permeation chromatography (GPC) against a polystyrene standard.

Exemplary methods for preparing the triazine ring-containing hyperbranched polymer used in the invention are described. The preparation methods are, divided up below into Schemes 1, 2 and 3, each of which is further divided into "a", "b", etc.

For example, as shown in Scheme 1-a below, a hyperbranched polymer having the recurring structure (23') can be obtained by reacting a cyanuric halide (26) with an amino group-bearing bisaminophenylfluorene compound (27) in a suitable organic solvent.

As shown in Scheme 1-b below, a hyperbranched polymer having the recurring structure (24') can be obtained by reacting a cyanuric halide (26) with an m-phenylenediamine compound (28) in a suitable organic solvent.

Scheme 1-a

[Chemical Formula 20]

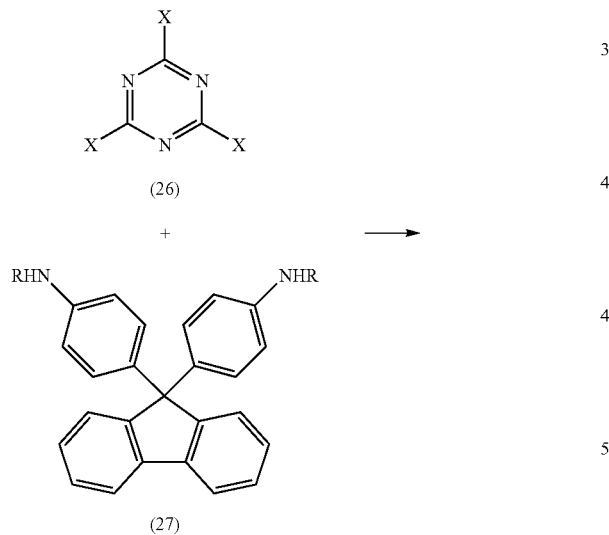

Scheme 1-b

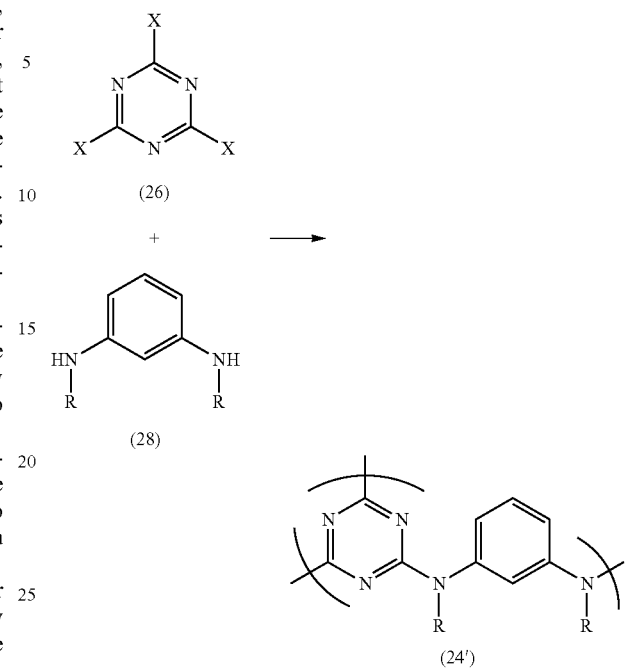

In the above formulas, each occurrence of X is independently a halogen atom; and R is as defined above.

Alternatively, as shown in Scheme 2-a below, a hyperbranched polymer having the recurring structure (23') can be synthesized from a compound (29) obtained by reacting equimolar amounts of a cyanuric halide (26) and an amino group-bearing bisaminophenylfluorene compound (27) in a suitable organic solvent.

As shown in Scheme 2-b below, a hyperbranched polymer having the recurring structure (24') can be synthesized from a compound (30) obtained by reacting equimolar amounts of a cyanuric halide (26) and an m-phenylenediamine compound (28) in a suitable organic solvent.

Scheme 2-a

[Chemical Formula 21]

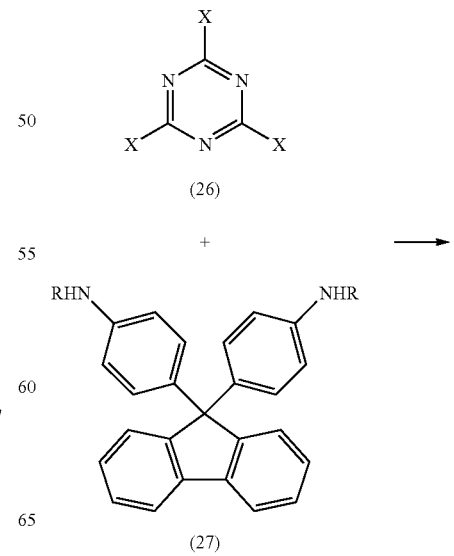

-continued

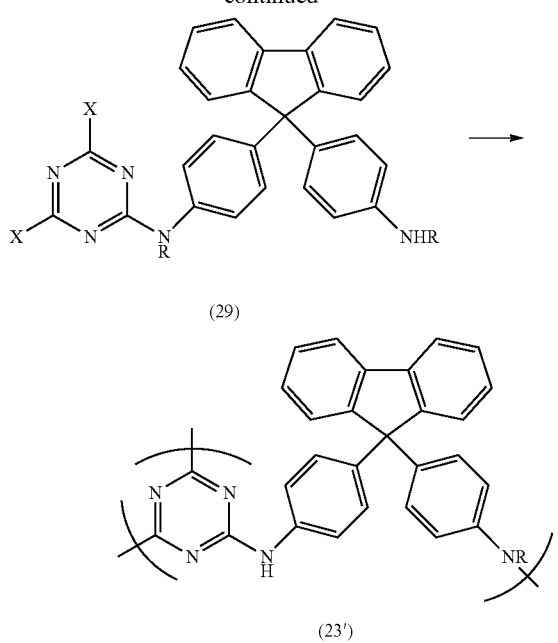

(29)

(23')

Scheme 2-b

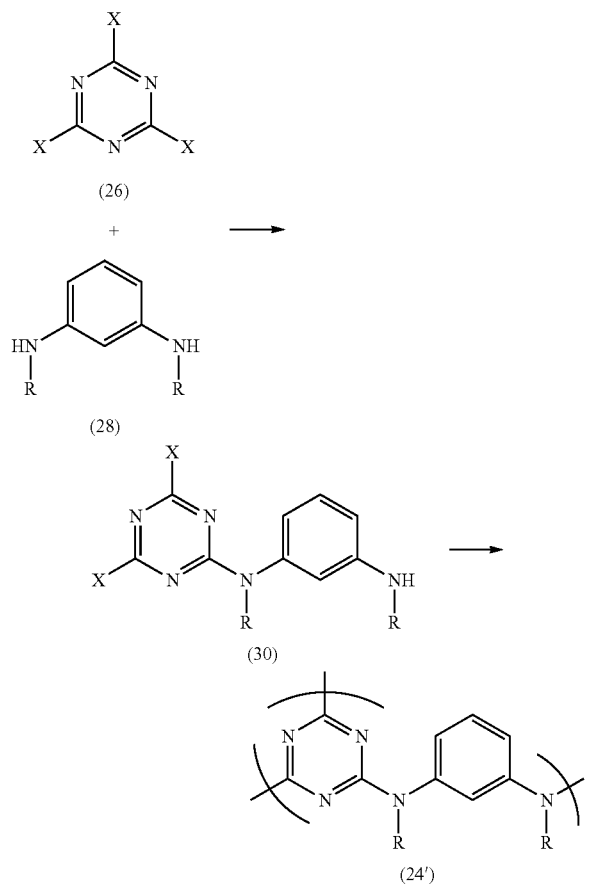

(26)

+

(28)

(30)

(24')

In the above formulas, each occurrence of X is independently a halogen atom; and R is as defined above.

By using the above methods, the hyperbranched polymer of the invention can be easily and safely produced at a low cost. Because the reaction time in these methods is much shorter than in the synthesis of ordinary polymers, these production methods are compatible with recent concerns for the environment and are capable of reducing $CO_2$ emissions. Moreover, such methods can carry out stable production even when the scale of production is greatly expanded, and thus allow a stable supply system to be maintained even at an industrial level.

In particular, taking into account the stability of cyanuric chloride as a starting material and also from an industrial perspective, the production methods of Scheme 2 are more preferred.

In the methods of Schemes 1 and 2, the respective starting materials may be charged in any suitable amounts so long as the target hyperbranched polymer is obtained, although the use of from 0.01 to 10 equivalents of the diamino compound (27), (28) per equivalent of the cyanuric halide (26) is preferred.

In the method of Scheme 1 in particular, it is preferable to avoid using 3 equivalents of the diamino compound (27), (28) per 2 equivalents of the cyanuric halide (26). By having the number of equivalents of the respective functional groups differ from this ratio, the formation of a gel can be prevented.

To obtain hyperbranched polymers of various molecular weights which have many terminal triazine rings, it is preferable to use the diamino compound (27), (28) in an amount of less than 3 equivalents per 2 equivalents of the cyanuric halide (26).

On the other hand, to obtain hyperbranched polymers of various molecular weights which have many terminal amines, it is preferable to use the cyanuric halide (26) in an amount of less than 2 equivalents per 3 equivalents of the diamino compound (27), (28).

For example, in cases where a thin film has been produced, in order for the film to have an excellent transparency and light resistance, a hyperbranched polymer having many terminal triazine rings is preferred.

By suitably regulating the amounts of the diamino compound (27), (28) and the cyanuric halide (26) in this way, the molecular weight of the resulting hyperbranched polymer can easily be regulated.

Various solvents that are commonly used in this type of reaction may be used as the organic solvent. Illustrative examples include tetrahydrofuran, dioxane, dimethylsulfoxide; amide solvents such as N,N-dimethylformamide, N-methyl-2-pryrrolidone, tetramethylurea, hexamethylphosphoramide, N,N-dimethylacetamide, N-methyl-2-piperidone, N,N-dimethylethyleneurea, N,N,N',N'-tetramethylmalonamide, N-methylcaprolactam, N-acetylpyrrolidine, N,N-diethylacetamide, N-ethyl-2-pyrrolidone, N,N-dimethylpropionamide, N,N-dimethylisobutyramide, N-methylformamide and N,N'-dimethylpropyleneurea; and mixed solvents thereof.

Of the above, N,N-dimethylformamide, dimethylsulfoxide, N-methyl-2-pyrrolidone, N,N-dimethylacetamide and mixed solvents thereof are preferred. N,N-Dimethylacetamide and N-methyl-2-pyrrolidone are especially preferred.

In the Scheme 1 reaction and the second stage reaction in Scheme 2, the reaction temperature may be suitably set in the range from the melting point of the solvent used to the boiling point of the solvent, although the temperature is preferably from about 0° C. to about 150° C., and more preferably from 60 to 100° C.

In the Scheme 1 reaction in particular, to suppress linearity and increase the degree of branching, the reaction temperature is preferably from 60 to 150° C., more preferably from 80 to 150° C., and even more preferably from 80 to 120° C.

In the first stage reaction of Scheme 2, the reaction temperature may be suitably set in the range from the melting point of the solvent used to the boiling point of the solvent, with a temperature of from about −50 to about 50° C. being preferred, a temperature of from about −20 to about 50° C. being more preferred, a temperature of from about −10 to about 50° C. being even more preferred, and a temperature of from −10 to 10° C. being still more preferred.

In the Scheme 2 method in particular, the use of a two-stage process with a first step involving reaction at from −50 to 50° C., followed by a second step involving reaction at from 60 to 150° C. is preferred.

In each of the above reactions, the ingredients may be added in any order. However, in the Scheme 1 reaction, the best method is to heat a solution containing either the cyanuric halide (26) or the diamino compound (27), (28) and the organic solvent to a temperature of from 60 to 150° C., and preferably from 80 to 150° C., then add the remaining ingredient—the diamino compound (27), (28) or the cyanuric halide (26)—to the resulting solution at this temperature.

In this case, either ingredient may be used as the ingredient which is initially dissolved in the solvent or as the ingredient which is subsequently added, although a method wherein the cyanuric halide (26) is added to a heated solution of the diamino compound (27), (28) is preferred.

In the Scheme 2 reactions, either ingredient may be used as the ingredient which is initially dissolved in the solvent or as the ingredient which is subsequently added, although a method wherein the diamino compound (27), (28) is added to a cooled solution of the cyanuric halide (26) is preferred.

The subsequently added ingredient may be added neat or may be added as a solution of the ingredient dissolved in an organic solvent such as any of those mentioned above. However, taking into account the ease of the operations and the controllability of the reaction, the latter approach is preferred.

Also, addition may be carried out gradually such as in a dropwise manner, or the entire amount may be added all at once in a batchwise manner.

In Scheme 1, even in cases where the reaction is carried out in a single stage (without raising the temperature in a stepwise fashion), in a heated state and after both compounds have been mixed, the desired triazine ring-containing hyperbranched polymer can be obtained without gelation.

In the Scheme 1 reaction and the second stage reaction in Scheme 2, various bases which are commonly used during or after polymerization may be added.

Illustrative examples of such bases include potassium carbonate, potassium hydroxide, sodium carbonate, sodium hydroxide, sodium bicarbonate, sodium ethoxide, sodium acetate, lithium carbonate, lithium hydroxide, lithium oxide, potassium acetate, magnesium oxide, calcium oxide, barium hydroxide, trilithium phosphate, trisodium phosphate, tripotassium phosphate, cesium fluoride, aluminum oxide, ammonia, trimethylamine, triethylamine, diisopropylmethylamine, diisopropylethylamine, N-methylpiperidine, 2,2,6,6-tetramethyl-N-methylpiperidine, pyridine, 4-dimethylaminopyridine and N-methylmorpholine.

The amount of base added per equivalent of the cyanuric halide (26) is preferably from 1 to 100 equivalents, and more preferably from 1 to 10 equivalents. These bases may also be used in the form of an aqueous solution.

Although it is preferable for no starting ingredients to remain in the resulting polymer, some starting material may remain, provided this does not interfere with the advantageous effects of the invention.

In the methods of both schemes, following reaction completion, the product can be easily purified by a suitable technique such as reprecipitation.

Also, in the present invention, some portion of the halogen atoms on at least one terminal triazine ring may be capped by, for example, an alkyl, aralkyl, aryl, alkylamino, alkoxysilyl-containing alkylamino, aralkylamino, arylamino, alkoxy, aralkyloxy, aryloxy or ester group.

Of these, alkylamino, alkoxysilyl-containing alkylamino, aralkylamino and arylamino groups are preferred. Alkylamino and arylamino groups are more preferred. Arylamino groups are even more preferred.

Illustrative examples of ester groups include methoxycarbonyl and ethoxycarbonyl.

Illustrative examples of alkylamino groups include methylamino, ethylamino, n-propylamino, isopropylamino, n-butylamino, isobutylamino, s-butylamino, t-butylamino, n-pentylamino, 1-methyl-n-butylamino, 2-methyl-n-butylamino, 3-methyl-n-butylamino, 1,1-dimethyl-n-propylamino, 1,2-dimethyl-n-propylamino, 2,2-dimethyl-n-propylamino, 1-ethyl-n-propylamino, n-hexylamino, 1-methyl-n-pentylamino, 2-methyl-n-pentylamino, 3-methyl-n-pentylamino, 4-methyl-n-pentylamino, 1,1-dimethyl-n-butylamino, 1,2-dimethyl-n-butylamino, 1,3-dimethyl-n-butylamino, 2,2-dimethyl-n-butylamino, 2,3-dimethyl-n-butylamino, 3,3-dimethyl-n-butylamino, 1-ethyl-n-butylamino, 2-ethyl-n-butylamino, 1,1,2-trimethyl-n-propylamino, 1,2,2-trimethyl-n-propylamino, 1-ethyl-1-methyl-n-propylamino and 1-ethyl-2-methyl-n-propylamino.

Illustrative examples of aralkylamino groups include benzylamino, methoxycarbonylphenylmethylamino, ethoxycarbonylphenylmethylamino, p-methylphenylmethylamino, m-methylphenylmethylamino, o-ethylphenylmethylamino, m-ethylphenylmethylamino, p-ethylphenylmethylamino, 2-propylphenylmethylamino, 4-isopropylphenylmethylamino, 4-isobutylphenylmethylamino, naphthylmethylamino, methoxycarbonylnaphthylmethylamino and ethoxycarbonylnaphthylmethylamino.

Illustrative examples of arylamino groups include phenylamino, methoxycarbonylphenylamino, ethoxycarbonylphenylamino, naphthylamino, methoxycarbonylnaphthylamino, ethoxycarbonylnaphthylamino, anthranylamino, pyrenylamino, biphenylamino, terphenylamino and fluorenylamino.

Alkoxysilyl-containing alkylamino groups are exemplified by monoalkoxysilyl-containing alkylamino groups, dialkoxysilyl-containing alkylamino groups and trialkoxysilyl-containing alkylamino groups. Illustrative examples include 3-trimethoxysilylpropylamino, 3-triethoxysilylpropylamino, 3-dimethylethoxysilylpropylamino, 3-methyldiethoxysilylpropylamino, N-(2-aminoethyl)-3-dimethylmethoxysilylpropylamino, N-(2-aminoethyl)-3-methyldimethoxysilylpropylamino and N-(2-aminoethyl)-3-trimethoxysilylpropylamino.

Illustrative examples of aryloxy groups include phenoxy, naphthoxy, anthranyloxy, pyrenyloxy, biphenyloxy, terphenyloxy and fluorenyloxy.

Illustrative examples of aralkyloxy groups include benzyloxy, p-methylphenylmethyloxy, m-methylphenylmethyloxy, o-ethylphenylmethyloxy, m-ethylphenylmethyloxy, p-ethylphenylmethyloxy, 2-propylphenylmethyloxy, 4-isopropylphenylmethyloxy, 4-isobutylphenylmethyloxy and α-naphthylmethyloxy.

Alkyl groups, aralkyl groups and aryl groups are exemplified in the same way as described earlier in the specification.

These groups can be easily introduced by substituting a halogen atom on a triazine ring with a compound that furnishes the corresponding substituent. For example, as shown in Schemes 3-a and 3-b below, by adding an aniline derivative and inducing a reaction, hyperbranched polymers (31), (32) having a phenylamino group on at least one chain end are obtained.

Scheme 3-a

[Chemical Formula 22]

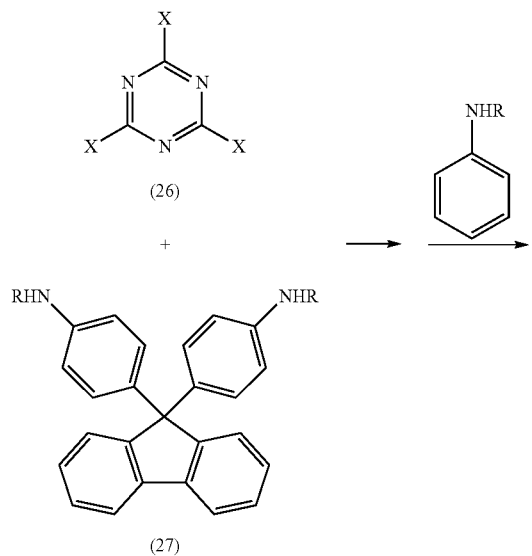

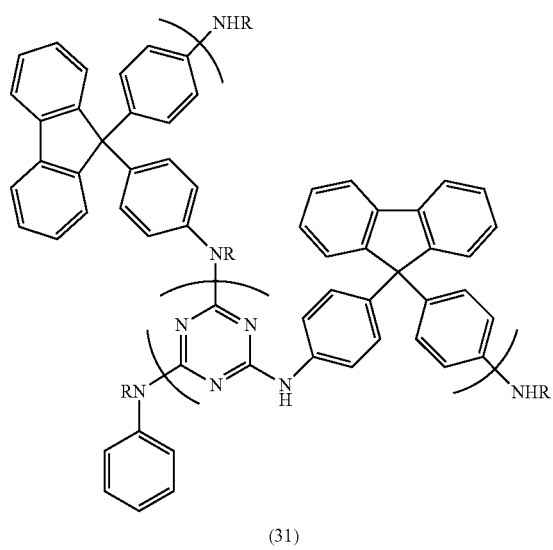

Scheme 3-b

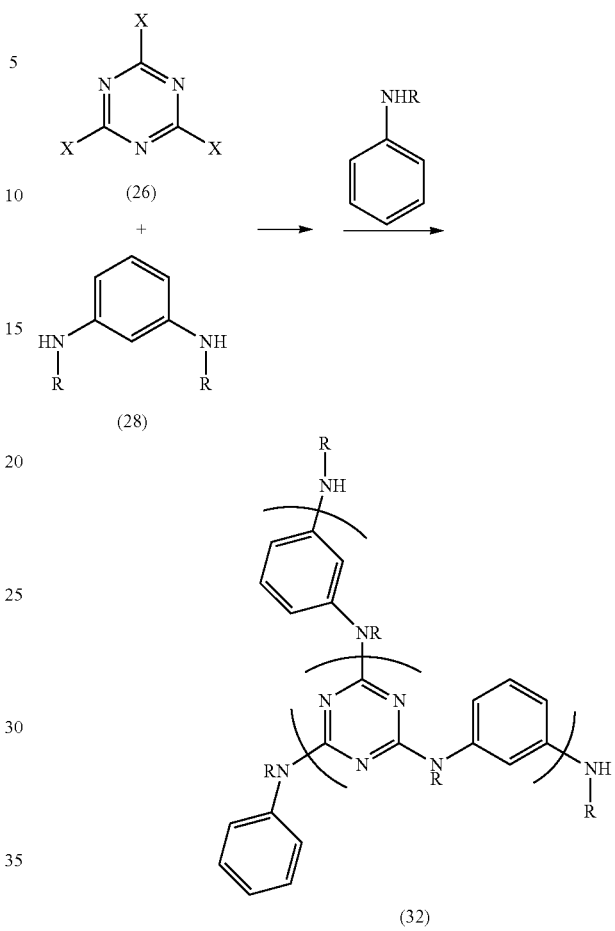

In these formulas, X and R are as defined above.

At this time, by reacting the cyanuric halide with a diaminoaryl compound while at the same time charging an organic monoamine, i.e., in the presence of an organic monoamine, it is possible to obtain a flexible hyperbranched polymer having a low degree of branching in which the rigidity of the hyperbranched polymer has been diminished.

Because the hyperbranched polymer obtained in this way has an excellent solubility in a solvent (meaning that aggregation is inhibited) and has an excellent crosslinkability with a crosslinking agent, it is especially advantageous when used as a composition in combination with the subsequently described crosslinking agent.

An alkyl monoamine, aralkyl monoamine or aryl monoamine may be used here as the organic monoamine.

Illustrative examples of alkyl monoamines include methylamine, ethylamine, n-propylamine, isopropylamine, n-butylamine, isobutylamine, s-butylamine, t-butylamine, n-pentylamine, 1-methyl-n-butylamine, 2-methyl-n-butylamine, 3-methyl-n-butylamine, 1,1-dimethyl-n-propylamine, 1,2-dimethyl-n-propylamine, 2,2-dimethyl-n-propylamine, 1-ethyl-n-propylamine, n-hexylamine, 1-methyl-n-pentylamine, 2-methyl-n-pentylamine, 3-methyl-n-pentylamine, 4-methyl-n-pentylamine, 1,1-dimethyl-n-butylamine, 1,2-dimethyl-n-butylamine, 1,3-dimethyl-n-butylamine, 2,2-dimethyl-n-butylamine, 2,3-dimethyl-n-butylamine, 3,3-dimethyl-n-butylamine, 1-ethyl-n-butylamine, 2-ethyl-n-butylamine, 1,1,2-trimethyl-n-propylamine, 1,2,2-trimethyl-n-propylamine, 1-ethyl-1-methyl-n-propylamine, 1-ethyl-2-methyl-n-propylamine and 2-ethylhexylamine.

Illustrative examples of aralkyl monoamines include benzylamine, p-methoxycarbonylbenzylamine, p-ethoxycarbonylbenzylamine, p-methylbenzylamine, m-methylbenzylamine and o-methoxybenzylamine.

Illustrative examples of aryl monoamines include aniline, p-methoxycarbonylaniline, p-ethoxycarbonylaniline, p-methoxyaniline, 1-naphthylamine, 2-naphthylamine, anthranylamine, 1-aminopyrene, 4-biphenylylamine, o-phenylaniline, 4-amino-p-terphenyl and 2-aminofluorene.

In this case, the amount of organic monoamine used per equivalent of the cyanuric halide is set to preferably from 0.05 to 500 equivalents, more preferably from 0.05 to 120 equivalents, and even more preferably from 0.05 to 50 equivalents.

To suppress linearity and increase the degree of branching, the reaction temperature in this case is preferably from 60 to 150° C., more preferably from 80 to 150° C., and even more preferably from 80 to 120° C.

However, mixing of the three ingredients—an organic monoamine, a cyanuric halide and a diaminoaryl compound—may be carried out at a low temperature, in which case the temperature is set to preferably from about −50° C. to about 50° C., more preferably from about −20° C. to about 50° C., and even more preferably from about −20° C. to about 10° C. Following low-temperature charging, it is preferable to raise the temperature without interruption (in a single step) to the polymerization temperature and carry out the reaction.

Alternatively, the mixing of two ingredients—a cyanuric halide and a diaminoaryl compound—may be carried out at a low temperature, in which case the temperature is set to preferably from about −50° C. to about 50° C., more preferably from about −20° C. to about 50° C., and even more preferably from about −20° C. to about 10° C. Following low-temperature charging, it is preferable to raise the temperature without interruption (in a single step) to the polymerization temperature and carry out the reaction.

The reaction of the cyanuric halide with the diaminoaryl compound in the presence of such an organic monoamine may be carried out using an organic solvent like those mentioned above.

In a completely dried and solid state, the triazine ring-containing hyperbranched polymer described above, owing to the absence—both within and between the polymer molecules—of any compound that may serve as a solvent, forms strong hydrogen bonds. Specific examples of the hydrogen bonds include hydrogen bonds between nitrogen atoms on the triazine rings of the triazine ring-containing polymer and hydrogen atoms at amine sites (from a diarylamine), and, in cases where the polymer ends have been capped with amines, hydrogen bonds between the terminal amines. In these hydrogen bonds, the bonds form due to non-covalent, attractive interactions.

Owing to the strong hydrogen bonds in this solid state, although the polymer itself is inherently of a soluble nature, these hydrogen bonds are sometimes maintained even during solution preparation using a solvent, as a result of which the polymer may have difficulty dissolving in the solvent.

In light of the above, a dissolution promoter, which is a compound that breaks hydrogen bonds which have formed within and/or between molecules of the triazine ring-containing hyperbranched polymer, is added to the film-forming composition of the invention.

By adding a dissolution promoter, the above hydrogen bonds are broken and moreover recombine after being broken, as a result of which the hydrogen bond environment in the solid state changes and the solubility in the solvent dramatically rises. Moreover, once the state of a solution is reached, the hydrogen bond environment becomes saturated and a high solubility emerges.

The solution promoter should act to break at least some of the hydrogen bonds at the respective sites described above, and may also serve to recombine the hydrogen bonds after they have been broken. That is, the solution promoter should be capable of changing the hydrogen bond environment when the triazine ring-containing hyperbranched polymer was a solid to a different environment at the time of dissolution in a solvent or following such dissolution.

Such dissolution promoters are not particularly limited, so long as they have the above effects. However, a compound containing one or more group selected from among hydroxyl, carbonyl, carboxyl, amino and amide groups and urethane and urea bonds is preferred.

Dissolution promoters having such groups (or bonds) are exemplified by water, acids, bases, and salts formed from acids and bases.

Examples of water that may be used include ion-exchanged water and ultrapure water. Because water is the smallest unit that acts as a dissolution promoter, it readily makes its way between molecules of the triazine ring-containing hyperbranched polymer of the invention, in addition to which it easily forms new hydrogen bonds. For these reasons, it is an ideal dissolution promoter.

Acids here include, in a broad sense, Lewis acids, inorganic acids, organic acids and the like. Illustrative examples include hydrochloric acid, perchloric acid, chloric acid, boric acid, bromic acid, iodic acid, perbromic acid, metaperiodic acid, permanganic acid, thiocyanic acid, tetrafluoroboric acid, hexafluorophosphoric acid, sulfuric acid, nitric acid, phosphoric acid, acetic acid, formic acid, carbonic acid, oxalic acid, citric acid, amino acid, hyaluronic acid, benzoic acid, salicylic acid, acrylic acid, methacrylic acid, benzenesulfonic acid, tosylic acid, camphorsulfonic acid, hydroxybenzenesulfonic acid, 5-sulfosalicylic acid, 4-aminobenzoic acid, anthranilic acid, 5-methylisophthalic acid, p-toluic acid, m-toluic acid, o-toluic acid, p-tolylacetic acid, 2-hydroxyacetophenone, 2-phenylacetamide, 3-phenylpropionic acid, 4-aminophenethyl alcohol, 3-phenyl-1-propanol, 4-hydroxymethylbenzoic acid, terephthalaldehydic acid, 3,5-dimethylbenzoic acid, trifluoromethanesulfonic acid, fluorosulfonic acid, dodecylbenzenesulfonic acid, polystyrenesulfonic acid, propylene glycol monomethyl ether, propylene glycol, propylene glycol monoethyl ether, propylene glycol monobutyl ether, diethylene glycol dimethyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol, 1-octanol, ethylene glycol, hexylene glycol, trimethylene glycol, cyclohexanol, 1,3-butanediol, 1,4-butanediol, 2,3-butanediol, benzyl alcohol, furfuryl alcohol, tetrahydrofurfuryl alcohol, γ-butyrolactone, ethylene glycol dimethyl ether, ethylene glycol monomethyl ether, ethylene glycol monoethyl ether, ethylene glycol monoisopropyl ether, ethylene glycol methyl ether acetate, ethylene glycol monobutyl ether, acetone, methyl ethyl ketone, methyl isopropyl ketone, diethyl ketone, methyl isobutyl ketone, methyl n-butyl ketone, cyclohexanone, ethyl acetate, isopropyl acetate ketone, n-propyl acetate, isobutyl acetate, n-butyl acetate, methanol, ethanol, isopropanol, tert-butanol, allyl alcohol, n-propanol, 2-methyl-2-butanol, isobutanol, n-butanol, 2-methyl-1-propanol, 2-methyl-1-butanol, 1-pentanol, 2-methyl-1-pentanol, 2-ethylhexanol, 1-methoxy-2-butanol, diacetone alcohol, isopropyl ether and 1,4-dioxane.

Bases here include, in a broad sense, Lewis bases, inorganic bases, organic bases and the like. Illustrative examples include lithium hydroxide, sodium hydroxide, potassium hydroxide, rubidium hydroxide, cesium hydroxide, tetramethylammonium hydroxide, tetraethylammonium hydroxide, calcium hydroxide, strontium hydroxide, barium hydroxide, trimethylsulfonium hydroxide, diphenyliodonium hydroxide, ammonia water, pyridine, triethylamine, 1,8-diazabicyclo[5,4,0]-7-undecene, benzamide, 4-picoline, 4-aminopyridine, 4-hydroxypyridine, 4-mercaptopyridine, 3-picoline, 3-aminopyridine, 2-picoline, 2-aminopyridine, 3-hydroxypyridine, 2-hydroxypyridine, 4-ethylpyridine, 3,5-lutidine, 3,4-lutidine, 2,6-lutidine, 2,5-dimethylpyrrole, 2,6-diaminopyridine, 3-ethylpyridine, 3,4-diaminopyridine, 4-pyridinecarboxaldehyde, 4-methoxypyridine, 4-picolylamine, 3-vinylpyridine, 3-ethynylpyridine, 2-methylimidazole, 2,3,5-trimethylpyrazine, 3-aminopyrazole, 2-aminopyrimidine, 2-mercaptopyrimidine, 2-hydroxypyrimidine, 4,6-pyrimidinediamine, 2,4-diaminopyrimidine, 4,6-dihydroxypyrimidine, benzotriazole and tolyltriazole.

Alternatively, the dissolution promoter may be a combination of the above-described acids and bases, such combinations being exemplified by amine carboxylates, amine sulfates, amine nitrates and amine nitrites.

Illustrative examples include dicyclohexylammonium nitrite, dicyclohexylammonium salicylate, monoethanolamine benzoate, dicyclohexylammonium benzoate, diisopropylammonium benzoate, diisopropylammonium nitrite, cyclohexylamine carbamate, nitronaphthaleneammonium nitrite, cyclohexylamine benzoate, dicyclohexylammonium cyclohexane carboxylate, cyclohexylamine cyclohexane carboxylate, dicyclohexylammonium acrylate and cyclohexylamine acrylate.

The dissolution promoter content within in the composition, although not particularly limited, is preferably from 0.01 to 100 parts by weight, more preferably from 0.1 to 50 parts by weight, and even more preferably from 1 to 20 parts by weight, per 100 parts by weight of the triazine ring-containing hyperbranched polymer (solids basis). The dissolution promoter content may be set within a range that provides the composition with a good film formability and does not markedly alter the optical properties of the organic film produced.

As described above, the dissolution promoter is most effective at the time that the triazine ring-containing hyperbranched polymer is dissolved in a solvent.

Illustrative examples of such solvents include toluene, p-xylene, o-xylene, m-xylene, ethylbenzene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-methoxy-2-propanol, tetrahydrofuran, 1,4-dioxane, N,N-dimethylformamide, N,N-dimethylacetamide, N-methylpyrrolidone, 1,3-dimethyl-2-imidazolidinone, dimethylsulfoxide and N-cyclohexyl-2-pyrrolidinone. These may be used singly or two or more may be used in combination.

In this case, the triazine ring-containing hyperbranched polymer and the solvent may be mixed together, and the dissolution promoter subsequently added; the triazine ring-containing hyperbranched polymer and the dissolution promoter may be mixed together, and the solvent subsequently added; or the solvent and the dissolution promoter may be mixed together, and the triazine ring-containing hyperbranched polymer subsequently added.

Aside from a triazine ring-containing hyperbranched polymer and a dissolution promoter, the film-forming composition of the invention may include also other ingredients, such as leveling agents, surfactants and crosslinking agents, provided doing so does not interfere with the advantageous effects of the invention.

Illustrative examples of surfactants include the following nonionic surfactants: polyoxyethylene alkyl ethers such as polyoxyethylene lauryl ether, polyoxyethylene stearyl ether, polyoxyethylene cetyl ether and polyoxyethylene oleyl ether; polyoxyethylene alkylaryl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; and additionally include fluorosurfactants such as those available under the trade names Eftop EF301, EF303 and EF352 (from Mitsubishi Materials Electronic Chemicals Co., Ltd. (formerly Jemco Inc.)), Megafac F171, F173, R-08, R-30 F-553 and F-554 (DIC Corporation), Fluorad FC430 and FC431 (Sumitomo 3M, Ltd.), Asahi-Guard AG710 and Surflon S-382, SC101, SC102, SC103, SC104, SC105 and SC106 (Asahi Glass Co., Ltd.); and also the organosiloxane polymers KP341 (Shin-Etsu Chemical Co., Ltd.) and BYK-302, BYK-307, BYK-322, BYK-323, BYK-330, BYK-333, BYK-370, BYK-375 and BYK-378 (BYK-Chemie Japan KK).

These surfactants may be used singly or two or more may be used in combination. The amount of surfactant used per 100 parts by weight of the hyperbranched polymer is preferably from 0.0001 to 5 parts by weight, more preferably from 0.001 to 1 part by weight, and even more preferably from 0.01 to 0.5 part by weight.

The crosslinking agent is not particularly limited, provided it is a compound having a substituent capable of reacting with the hyperbranched polymer of the invention.

Such compounds are exemplified by melamine compounds having a crosslink-forming substituent such as a methylol group or a methoxymethyl group, substituted urea compounds, compounds containing a crosslink-forming substituent such as an epoxy group or an oxetane group, compounds containing a blocked isocyanate group, compounds having an acid anhydride group, compounds having a (meth)acryl group, and phenoplast compounds. From the standpoint of heat resistance and storage stability, a compound containing an epoxy group, a blocked isocyanate group or a (meth)acryl group is preferred.

A blocked isocyanate group is also preferred in that, because it crosslinks by forming a urea linkage and has a carbonyl group, the refractive index does not decrease.

When used in the treatment of polymer chain ends, it suffices for these compounds to have at least one crosslink-forming substituent; however, when used in crosslinking treatment between polymers, they must have at least two crosslink-forming substituents.

The epoxy compound has at least two epoxy groups on the molecule. Upon exposure of this compound to an elevated temperature during heat curing, the epoxy rings open and the crosslinking reaction proceeds via an addition reaction with the hyperbranched polymer used in the invention.

Illustrative examples of the crosslinking agent include
tris(2,3-epoxypropyl)isocyanate,
1,4-butanediol diglycidyl ether,
1,2-epoxy-4-(epoxyethyl)cyclohexane,
glycerol triglycidyl ether,
diethylene glycol diglycidyl ether,
2,6-diglycidylphenyl glycidyl ether,
1,1,3-tris[p-(2,3-epoxypropoxy)phenyl]propane,
1,2-cyclohexanedicarboxylic acid diglycidyl ester,
4,4'-methylenebis(N,N-diglycidylaniline),
3,4-epoxycyclohexylmethyl-3,4-epoxycyclohexanecarboxylate,
trimethylolethane triglycidyl ether,
bisphenol A diglycidyl ether and
pentaerythritol polyglycidyl ether.

Examples of commercial products that may be used include epoxy resins having at least two epoxy groups, such as YH-434 and YH-434L (from Tohto Kasei Co., Ltd.); epoxy resins having a cyclohexene oxide structure, such as Epolead GT-401, GT-403, GT-301 and GT-302, and also Celloxide 2021 and Celloxide 3000 (all from Daicel Chemical Industries, Ltd.); bisphenol A-type epoxy resins such as Epikote (now "jER") 1001, 1002, 1003, 1004, 1007, 1009, 1010 and 828 (all from Japan Epoxy Resin Co., Ltd.); bisphenol F-type epoxy resins such as Epikote (now "jER") 807 (Japan Epoxy Resin Co., Ltd.); phenol-novolak type epoxy resins such as Epikote (now "jER") 152 and 154 (Japan Epoxy Resin Co., Ltd.), and EPPN 201 and 202 (Nippon Kayaku Co.; Ltd.); cresol-novolak type epoxy resins such as EOCN-102, EOCN-103S, EOCN-104S, EOCN-1020, EOCN-1025 and EOCN-1027 (Nippon Kayaku Co., Ltd.), and Epikote (now "jER") 180S75 (Japan Epoxy Resin Co., Ltd.); alicyclic epoxy resins such as Denacol EX-252 (Nagase ChemteX Corporation), CY175, CY177 and CY179 (Ciba-Geigy AG), Araldite CY-182, CY-192 and CY-184 (Ciba-Geigy AG), Epiclon 200 and 400 (DIC Corporation), Epikote (now "jER") 871 and 872 (Japan Epoxy Resin Co., Ltd.), and ED-5661 and ED-5662 (Celanese Coating KK); and aliphatic polyglycidyl ethers such as Denacol EX-611, EX-612, EX-614, EX-622, EX-411, EX-512, EX-522, EX-421, EX-313, EX-314 and EX-321 (Nagase ChemteX Corporation).

The acid anhydride compound is a carboxylic acid anhydride obtained by carrying out a dehydration/condensation reaction between two carboxylic acid molecules. Upon exposure to an elevated temperature during heat curing, the anhydride ring opens and the crosslinking reaction proceeds by way of an addition reaction with the hyperbranched polymer used in this invention.

Illustrative examples of the acid anhydride compound include compounds having a single acid anhydride group on the molecule, such as phthalic anhydride, tetrahydrophthalic anhydride, hexahydrophthalic anhydride, methyl tetrahydrophthalic anhydride, methyl hexahydrophthalic anhydride, nadic anhydride, methyl nadic anhydride, maleic anhydride, succinic anhydride, octyl succinic anhydride and dodecenyl succinic anhydride; and compounds having two acid anhydride groups on the molecule, such as 1,2,3,4-cyclobutanetetracarboxylic dianhydride,
pyromellitic anhydride,
3,4-dicarboxy-1,2,3,4-tetrahydro-1-naphthalenesuccinic dianhydride,
bicyclo[3.3.0]octane-2,4,6,8-tetracarboxylic dianhydride,
5-(2,5-dioxotetrahydro-3-furanyl)-3-methyl-3-cyclohexene-1,2-dicarboxylic anhydride,
1,2,3,4-butanetetracarboxylic dianhydride,
3,3',4,4'-benzophenonetetracarboxylic dianhydride,
3,3',4,4'-biphenyltetracarboxylic dianhydride,
2,2-bis(3,4-dicarboxyphenyl)hexafluoropropane dianhydride and
1,3-dimethyl-1,2,3,4-cyclobutanetetracarboxylic dianhydride.

The (meth)acrylic compound is a compound having two or more (meth)acryl groups on the molecule. Upon exposure to an elevated temperature during heat curing, the crosslinking reaction proceeds by way of an addition reaction with the hyperbranched polymer used in the invention.

Illustrative examples of the compound having (meth)acryl groups include ethylene glycol diacrylate, ethylene glycol dimethacrylate, polyethylene glycol diacrylate, polyethylene glycol dimethacrylate, ethoxylated bisphenol A diacrylate, ethoxylated bisphenol A dimethacrylate, ethoxylated trimethylolpropane triacrylate, ethoxylated trimethylolpropane trimethacrylate, ethoxylated glycerol triacrylate, ethoxylated glycerol trimethacrylate, ethoxylated pentaerythritol tetraacrylate, ethoxylated pentaerythritol tetramethacrylate, ethoxylated dipentaerythritol hexaacrylate, polyglycerol monoethylene oxide polyacrylate, polyglycerol polyethylene glycol polyacrylate, dipentaerythritol hexaacrylate, dipentaerythritol hexamethacrylate, neopentyl glycol diacrylate, neopentyl glycol dimethacrylate, pentaerythritol triacrylate, pentaerythritol trimethacrylate, trimethylolpropane triacrylate, trimethylolpropane trimethacrylate, tricyclodecane dimethanol diacrylate, tricyclodecane dimethanol dimethacrylate, 1,6-hexanediol diacrylate and 1,6-hexanediol dimethacrylate.

The above compound having (meth)acryl groups may be acquired as a commercial product, illustrative examples of which include NK Ester A-200, A-400, A-600, A-1000, A-TMPT, UA-53H, 1G, 2G, 3G, 4G, 9G, 14G, 23G, ABE-300, A-BPE-4, A-BPE-6, A-BPE-10, A-BPE-20, A-BPE-30, BPE-80N, BPE-100N, BPE-200, BPE-500, BPE-900, BPE-1300N, A-GLY-3E, A-GLY-9E, A-GLY-20E, A-TMPT-3EO, A-TMPT-9EO, ATM-4E and ATM-35E (all from Shin-Nakamura Chemical Co., Ltd.); KAYARAD™ DPEA-12, PEG400 DA, THE-330 and RP-1040 (all from Nippon Kayaku Co., Ltd.); M-210 and M-350 (from Toagosei Co., Ltd.); KAYARAD™ DPHA, NPGDA and PET30 (Nippon Kayaku Co., Ltd.); and NK Ester A-DPH, A-TMPT, A-DCP, A-HD-N, TMPT, DCP, NPG and HD-N (all from Shin-Nakamura Chemical Co., Ltd.).

The compound containing blocked isocyanate groups is a compound having on the molecule at least two blocked isocyanate groups, i.e., isocyanate groups (—NCO) that have been blocked with a suitable protecting group, and in which, upon exposure of the compound to an elevated temperature during heat curing, the protecting groups (blocking moieties) are removed by thermal dissociation and the isocyanate groups that form as a result induce crosslinking reactions with the resin. This compound is exemplified by compounds having on the molecule at least two groups of the following formula (which groups may be the same or may each differ).

[Chemical Formula 23]

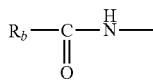

In the formula, $R_b$ is an organic group on the blocking moiety.

Such a compound can be obtained by, for example, reacting a suitable blocking agent with a compound having at least two isocyanate groups on the molecule.

Illustrative examples of compounds having at least two isocyanate groups on the molecule include polyisocyanates such as isophorone diisocyanate, 1,6-hexamethylene diisocyanate, methylenebis(4-cyclohexyl isocyanate) and trimethylhexamethylene diisocyanate, and also dimers and trimers thereof, as well as the reaction products of these with diols, triols, diamines or triamines.

Illustrative examples of the blocking agent include alcohols such as methanol, ethanol, isopropanol, n-butanol, 2-ethoxyhexanol, 2-N,N-dimethylaminoethanol, 2-ethoxyethanol and cyclohexanol; phenols such as phenol, o-nitrophenol, p-chlorophenol, and o-, m- or p-cresol; lactams such as ε-caprolactam; oximes such as acetone oxime, methyl ethyl ketone oxime, methyl isobutyl ketone oxime, cyclohexanone oxime, acetophenone oxime and benzophenone oxime; pyrazoles such as pyrazole, 3,5-dimethylpyrazole and 3-methylpyrazole; and thiols such as dodecanethiol and benzenethiol.

The compound containing blocked isocyanates may also be acquired as a commercial product, illustrative examples of which include B-830, B-815N, B-842N, B-870N, B-874N, B-882N, B-7005, B7030, B-7075 and B-5010 (all from Mitsui Chemicals Polyurethane, Inc.); Duranate™ 17B-60PX, TPA-B80E, MF-B60X, MF-K60X and E402-B80T (all from Asahi Kasei Chemicals Corporation); and KarenzMOI-BM™ (Showa Denko KK).

Aminoplast compounds are compounds which have at least two methoxymethylene groups on the molecule. Upon exposure to an elevated temperature during heat curing, crosslinking reactions proceed by way of demethanolization/condensation reactions with the hyperbranched polymer used in the invention.

Illustrative examples of melamine compounds include the Cymel series, such as hexamethoxymethylmelamine (Cymel™ 303), tetrabutoxymethylglycoluril (Cymel™ 1170) and tetramethoxymethylbenzoguanamine (Cymel™ 1123) (all from Nihon Cytec Industries, Inc.); and the Nikalac™ series, including the methylated melamine resins Nikalac™ MW-30HM, MW-390, MW-100LM and MX-750LM, and the methylated urea resins Nikalac™ MX-270, MX-280 and MX-290 (all from Sanwa Chemical Co., Ltd.).

Oxetane compounds are compounds which have at least two oxetanyl groups on the molecule. Upon exposure to an elevated temperature during heat curing, crosslinking reactions proceed by way of addition reactions with the hyperbranched polymer used in the invention.

Examples of compounds having oxetane groups include the oxetane group-bearing compounds OXT-221, OX-SQ-H and OX-SC (from Toagosei Co., Ltd.).

Phenoplast compounds are compounds which have at least two hydroxymethylene groups on the molecule. Upon exposure to an elevated temperature during heat curing, crosslinking reactions proceed by way of dehydration/condensation reactions with the hyperbranched polymer used in the invention.

Illustrative examples of phenoplast compounds include 2,6-dihydroxymethyl-4-methylphenol, 2,4-dihydroxymethyl-6-methylphenol, bis(2-hydroxy-3-hydroxymethyl-5-methylphenyl)methane, bis(4-hydroxy-3-hydroxymethyl-5-methylphenyl)methane, 2,2-bis(4-hydroxy-3,5-dihydroxymethylphenyl)propane, bis(3-formyl-4-hydroxyphenyl)methane, bis(4-hydroxy-2,5-dimethylphenyl)formylmethane and α,α-bis(4-hydroxy-2,5-dimethylphenyl)-4-formyltoluene.

The phenoplast compound may also be acquired as a commercial product, illustrative examples of which include 26DMPC, 46DMOC, DM-BIPC-F, DM-BIOC-F, TM-BIP-A, BISA-F, BI25X-DF and BI25X-TPA (all from Asahi Organic Chemicals Industry Co., Ltd.).

These crosslinking agents may be used singly or two or more may be used in combination. The amount of crosslinking agent used per 100 parts by weight of the hyperbranched polymer is preferably from 1 to 100 parts by weight. From the standpoint of the solvent resistance, the lower limit is preferably 10 parts by weight, and more preferably 20 parts by weight. From the standpoint of control of the refractive index, the upper limit is preferably 50 parts by weight, and more preferably 30 parts by weight.

When a crosslinking agent is used, the crosslinking agent reacts with reactive end-group substituents on the hyperbranched polymer, which may make it possible to achieve such advantageous effects as increasing the film density, increasing the heat resistance and increasing the thermal relaxation properties.

Ingredients other than the above may also be added in any step during preparation of the inventive composition.

The film-forming composition of the invention, by being applied onto a base material and subsequently heated where necessary, is able to form a desired film.

Any suitable method may be used for applying the composition, such as spin coating, dipping, flow coating, inkjet printing, spraying, bar coating, gravure coating, slit coating, roll coating, transfer printing, brush coating, blade coating and air knife coating.

Illustrative examples of the base material include silicon, indium-tin oxide (ITO)-coated glass, indium zinc oxide (IZO)-coated glass, polyethylene terephthalate (PET), plastic, glass, quartz and ceramic. Use can also be made of a flexible base material having pliability.

The temperature at which baking is carried out in order to evaporate the solvent is not subject to any particular limitation. For example, baking may be carried out at between 40 and 400° C. In such cases, to achieve more uniform film formability or to induce the reaction to proceed on the base material, temperature change may be carried out in two or more stages.

The baking process is not particularly limited. For example, solvent evaporation may be effected using a hot plate or an oven, and under a suitable atmosphere, such as in open air, in nitrogen or another inert gas, or in a vacuum.

As for the bake temperature and time, conditions which are compatible with the processing steps for the target electronic device should be selected. Bake conditions such that the physical values of the resulting film conform to the required characteristics of the electronic device should be selected.

Because the film made of the inventive composition that has been obtained in this way is able to achieve a high heat resistance, high transparency, high refractive index, high solubility and low volume shrinkage, it can be advantageously used as a component in the fabrication of electronic devices such as liquid-crystal displays, organic electroluminescent (EL) displays, optical semiconductor (LED) devices, solid-state image sensors, organic thin-film solar cells, dye-sensitized solar cells and organic thin-film transistors (TFT).

Where necessary, other resins (thermoplastic resins or thermoset resins) may be included in the inventive composition.

Illustrative, non-limiting, examples of such other resins include the following thermoplastic resins: polyolefin resins such as polyethylene (PE), polypropylene (PP), ethylene-vinyl acetate copolymers (EVA), and ethylene-ethyl acrylate copolymers (EEA); polystyrene resins such as polystyrene (PS), high-impact polystyrene (HIPS), acrylonitrile-styrene copolymers (AS), acrylonitrile-butadiene-styrene copolymers (ABS) and methyl methacrylate-styrene copolymers (MS); polycarbonate resins; vinyl chloride resins; polyamide resins; polyimide resins; (meth)acrylic resins such as polymethyl methacrylate (PMMA); polyester resins such as polyethylene terephthalate (PET), polybutylene terephthalate, polyethylene naphthalate, polybutylene naphthalate, polylactic acid (PLA), poly-3-hydroxybutyric acid, polycaprolactone, polybutylene succinate and polyethylene succinate/adipate; polyphenylene ether resins; modified polyphenylene ether resins; polyacetal resins; polysulfone resins; polyphenylene sulfide resins; polyvinyl alcohol resins; polyglycolic acid; modified starch; cellulose acetate and cellulose triacetate; chitin and chitosan; and lignin. Other exemplary resins include also thermoset resins such as phenolic resins, urea resins, melamine resins, unsaturated polyester resins, polyurethane resins and epoxy resins.

These resins may be used singly or two or more may be used in combination. The amount in which such resins are used per 100 parts by weight of the hyperbranched polymer is preferably from 1 to 10,000 parts by weight, and more preferably from 1 to 1,000 parts by weight.

For example, a composition with a (meth)acrylic resin may be obtained by including a (meth)acrylate compound in the composition and polymerizing the (meth)acrylate compound.

Illustrative examples of (meth)acrylate compounds include methyl (meth)acrylate, ethyl (meth)acrylate, ethylene glycol di(meth)acrylate, tetraethylene glycol di(meth)acrylate, polyethylene glycol di(meth)acrylate, propylene glycol di(meth)acrylate, polypropylene glycol di(meth)acrylate, 1,4-butanediol di(meth)acrylate, 1,6-hexanediol di(meth)acrylate, neopentylglycol di(meth)acrylate, trimethylolpropane trioxyethyl (meth)acrylate, tricyclodecane dimethanol di(meth)acrylate, tricyclodecanyl di(meth)acrylate, trimethylolpropane trioxypropyl (meth)acrylate, tris-2-hydroxyethyl isocyanurate tri(meth)acrylate, tris-2-hydroxyethyl isocyanurate di(meth)acrylate, 1,9-nonanediol di(meth)acrylate, pentaerythritol di(meth)acrylate, glycerol methacrylate acrylate, pentaerythritol tri(meth)acrylate, trimethylolpropane trimethacrylate, allyl (meth)acrylate, vinyl (meth)acrylate, epoxy(meth)acrylate, polyester (meth)acrylate and urethane (meth)acrylate.

The polymerization of these (meth)acrylate compounds may be carried out by light irradiation or heating in the presence of a photoradical initiator or a thermal radical initiator.

Examples of photoradical initiators include acetophenones, benzophenones, Michler's benzoyl benzoate, amyloxime ester, tetramethylthiuram monosulfide and thioxanthones.

Photocleavable photoradical initiators are especially preferred. Photocleavable photoradical initiators are listed on page 159 of Saishin UV Koka Gijutsu [Recent UV Curing Technology] (publisher, K. Takausu; published by Gijutsu Joho Kyokai KK; 1991).

Examples of commercial photoradical initiators include those available from CIBA Japan under the trade names Irgacure 184, 369, 651, 500, 819, 907, 784, 2959, CGI1700, CGI1750, CGI1850 and CG24-61, and the trade names Darocur 1116 and 1173; that available from BASF under the trade name Lucirin TPO; that available from UCB under the trade name Ubecryl P36; and those available under the trade names Esacure KIP150, KIP65LT, KIP100F, KT37, KT55, KT046 and KIP75/B from the Fratelli Lamberti Company.

The photoradical initiator is used in the range of preferably from 0.1 to 15 parts by weight, and more preferably from 1 to 10 parts by weight, per 100 parts by weight of the (meth)acrylate compound.

The solvent used in polymerization is exemplified by the same solvents as those mentioned above for the film-forming composition.

EXAMPLES

The invention is illustrated more fully below by way of Working Examples of the invention and Comparative Examples, although the invention is not limited by these Examples. The instruments used for measurement in the Examples were as follows.

$^1$H-NMR
    Instruments: Varian NMR System 400 NB (400 MHz) JEOL-ECA700 (700 MHz)
    Solvent used in measurement: DMSO-d6
    Reference material: Tetramethylsilane (TMS) ($\delta$=0.0 ppm)

GPC
    Instrument: HLC-8200 GPC (Tosoh Corporation)
    Columns: Shodex KF-804L+KF-805L
    Column temperature: 40° C.
    Solvent: Tetrahydrofuran (THF)
    Detector: UV (254 nm)
    Calibration curve: polystyrene standard Ellipsometer
    Instrument: VASE multiple incident angle spectroscopic ellipsometer (JA Woollam Japan)

Liquid-Borne Particle Counter
    Instruments: KZ-30W1 syringe sampler (Rion Co., Ltd.) KS-40B Particle sensor (Rion Co., Ltd.)

Ultraviolet-Visible Spectrophotometer
    Instrument: Shimadzu UV-3600 (Shimadzu Corporation)

Electron Microscope
    Instrument: S-4800 electron microscope (Shimadzu Corporation)

Synthesis Example 1

Synthesis of Triazine Ring-Containing Hyperbranched Polymer [3]

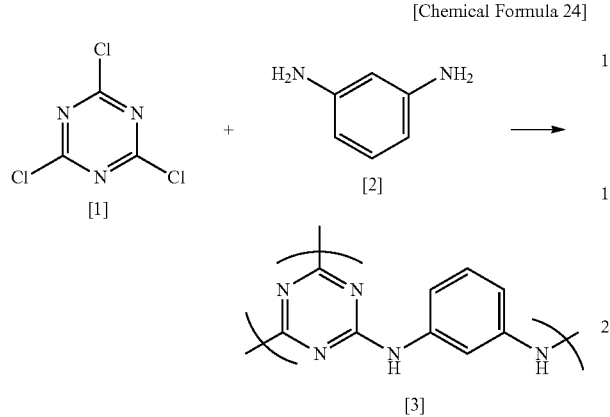

[Chemical Formula 24]

Under an air atmosphere, 28.94 g (0.27 mol) of m-phenylenediamine [2] (Aldrich) was added to a 1,000 mL four-neck flask, dissolved in 121 mL of N,N-dimethylacetamide (DMAc), and heated to 100° C. on an oil bath. Next, 36.91 g (0.20 mol) of 2,4,6-trichloro-1,3,5-triazine [1] (Tokyo Chemical Industry) dissolved in 261.5 mL of DMAc was added and polymerization was started.

After 50 minutes, 56.53 g (0.6 mol) of aniline (Junsei Chemical Co., Ltd.) was added and the flask contents were stirred for 1 hour, stopping polymerization. The reaction mixture was allowed to cool to room temperature, then was reprecipitated in a mixed solution of 28% ammonia water (30.4 g) dissolved in 1,600 mL of water and 520 mL of methanol. The precipitate was collected by filtration, redissolved in 400 mL of THF and 15 mL of N,N-dimethylformamide, then reprecipitated in 2,100 mL of ion-exchanged water. The resulting precipitate was collected by filtration and dried in a vacuum desiccator at 150° C. for 6 hours, yielding 49.78 g of the target polymeric compound [3] (abbreviated below as "HB-TmDA45"). FIG. 1 shows the measured $^1$H-NMR spectrum for HB-TmDA45. The HB-TmDA45 thus obtained was a compound having structural units of formula (1). The polystyrene-equivalent weight-average molecular weight Mw of HB-TmDA45, as measured by GPC, was 4,600, and the polydispersity Mw/Mn was 2.37.

An amount of 1.0 g of the HB-TmDA45 thus obtained was dissolved in 9.0 g of cyclohexanone (CHN), giving a clear, light yellow-colored solution. Using a spin coater, the resulting polymer varnish was spin-coated onto a glass substrate for 5 seconds at 200 rpm and for 30 seconds at 2,000 rpm, following which the solvent was removed by a 2-minute bake at 150° C. and a 5-minute bake at 250° C., thereby forming a film. The resulting film had a refractive index at 550 nm of 1.8030.

Example 1

A 10 mL pear-shaped flask was charged with 2.00 g of HB-TmDA45, following which 7.84 g of CHN and 0.16 g of ion-exchanged water were added (amount of ion-exchanged water: 2 wt % of total amount of solvent; solids content: 20 wt %). The time required for complete dissolution by stirring with a mechanical stirrer at a speed of 50 rpm was 17 hours.

"Complete dissolution" refers to a state in which, when examined visually, the flask contents have become a uniform and clear solution with no remaining solute whatsoever.

Example 2

A 10 mL pear-shaped flask was charged with 2.00 g of HB-TmDA45, following which 7.68 g of CHN and 0.32 g of ion-exchanged water were added (amount of ion-exchanged water: 4 wt % of total amount of solvent; solids content: 20 wt %). The time required for complete dissolution by stirring with a mechanical stirrer at a speed of 50 rpm was 16 hours.

Example 3

A 10 mL pear-shaped flask was charged with 2.00 g of HB-TmDA45, following which 7.52 g of CHN and 0.48 g of ion-exchanged water were added (amount of ion-exchanged water: 4 wt % of total amount of solvent; solids content: 20 wt %). The time required for complete dissolution by stirring with a mechanical stirrer at a speed of 50 rpm was 16 hours.

Example 4

A 10 mL pear-shaped flask was charged with 1.80 g of HB-TmDA45, following which 7.20 g of CHN and a 20 wt % CHN solution containing 0.90 g of acetic acid were added (amount of acetic acid: 10 parts by weight per 100 parts by weight of polymer solids; solids content: 20 wt %). The time required for complete dissolution by stirring with a mechanical stirrer at a speed of 50 rpm was 16 hours.

Example 5

A 10 mL pear-shaped flask was charged with 1.80 g of HB-TmDA45, following which 7.20 g of CHN and a 20 wt % CHN solution containing 0.90 g of acrylic acid were added (amount of acrylic acid: 10 parts by weight per 100 parts by weight of polymer solids; solids content: 20 wt %). The time required for complete dissolution by stirring with a mechanical stirrer at a speed of 50 rpm was 16 hours.

Example 6

A 10 mL pear-shaped flask was charged with 1.80 g of HB-TmDA45, following which 7.20 g of CHN and a 20 wt % CHN solution containing 0.90 g of triethylamine were added (amount of triethylamine: 10 parts by weight per 100 parts by weight of polymer solids; solids content: 20 wt %). The time required for complete dissolution by stirring with a mechanical stirrer at a speed of 50 rpm was 12 hours.

Example 7

A 10 mL pear-shaped flask was charged with 1.80 g of HB-TmDA45, following which 7.20 g of CHN and a 20 wt % CHN solution containing 0.90 g of 3-aminopyrazole were added (amount of 3-aminopyrazole: 10 parts by weight per 100 parts by weight of polymer solids; solids content: 20 wt %). The time required for complete dissolution by stirring with a mechanical stirrer at a speed of 50 rpm was 13 hours.

Example 8

A 10 mL pear-shaped flask was charged with 1.80 g of HB-TmDA45, following which 6.8832 g of CHN, 0.3168 g of ion-exchanged water and a 20 wt % CHN solution containing 0.90 g of acetic acid were added (amount of acetic acid: 10 parts by weight per 100 parts by weight of polymer solids; amount of ion-exchanged water: 4 wt % of total amount of solvent; solids content: 20 wt %). The time required for complete dissolution by stirring with a mechanical stirrer at a speed of 50 rpm was 12 hours.

Example 9

A 10 mL pear-shaped flask was charged with 1.80 g of HB-TmDA45, following which 6.8832 g of CHN, 0.3168 g of ion-exchanged water and a 20 wt % CHN solution containing 0.90 g of triethylamine were added (amount of triethylamine: 10 parts by weight per 100 parts by weight of polymer solids; amount of ion-exchanged water: 4 wt % of total amount of solvent; solids content: 20 wt %). The time required for complete dissolution by stirring with a mechanical stirrer at a speed of 50 rpm was 11 hours.

Comparative Example 1

A 10 mL pear-shaped flask was charged with 2.00 g of HB-TmDA45, following which 8.00 g of CHN was added (solids content: 20 wt %). The time required for complete dissolution by stirring with a mechanical stirrer at a speed of 50 rpm was 26 hours.

From the above results, it was found that, although it takes 26 hours to dissolve HB-TmDA45 in CHN, the time required for dissolution can be greatly shortened by adding a dissolution promoter. The ability to shorten the time required for dissolution enables the cost during varnish production to be reduced and the production throughput to be increased.

Moreover, it was found that HB-TmDA45 forms strong hydrogen bonds within and between molecules of the polymer, and that dissolution can be accelerated by breaking the hydrogen bonds with a dissolution promoter.

Example 10

A 1 L pear-shaped flask was charged with 120.00 g of HB-TmDA45, following which 460.80 g of CHN and 19.20 g of ion-exchanged water were added and complete dissolution was carried out by stirring with a mechanical stirrer at a speed of 50 rpm.

To this 20 wt % solution of HB-TmDA45 were added each of the following: 120.00 g of a 20% CHN solution of B-882N (Mitsui Chemicals Polyurethane, Inc.) (20 parts by weight per 100 parts by weight of the polymer solids), 90.00 g of a 20% CHN solution of acetic acid (15 parts by weight per 100 parts by weight of the polymer solids), 6.00 g of a 1% CHN solution of Megafac F-554 (available under this trade name from DIC Corporation) (0.05 part by weight per 100 parts by weight of the polymer solids), and 84.3330 g of CHN, following which a mechanical stirrer was used to stir the flask contents for 30 minutes, giving a uniform 18 wt % polymer solution (abbreviated below as "HB-TmDA45V1").

Comparative Example 2

A 1 L pear-shaped flask was charged with 120.00 g of HB-TmDA45, following which 480.00 g of CHN was added and complete dissolution was carried out by stirring with a mechanical stirrer at a speed of 50 rpm.

To this 20 wt % solution of HB-TmDA45 were added each of the following: 120.00 g of a 20% CHN solution of B-882N (Mitsui Chemicals Polyurethane, Inc.) (20 parts by weight per 100 parts by weight of the polymer solids), 6.00 g of a 1% CHN solution of Megafac F-554 (available under this trade name from DIC Corporation) (0.05 part by weight per 100 parts by weight of the polymer solids), and 74.3333 g of CHN, following which a mechanical stirrer was used to stir the flask contents for 30 minutes, giving a uniform 18 wt % polymer solution (abbreviated below as "HB-TmDA45V2").

Example 11

The water and acetic acid-containing HB-TmDA45V1 solution obtained in Example 10 was pressure-filtered in a class 1000 clean room. A Mykrolis Optimizer DPR/DPR-L disposable filter available from Nihon Entegris K.K. was used for filtration. Filter connections: compression seals; type: DPR (short type); pore size: 0.05 µm; inlet/outlet: 6.35 mm; vent/drain: 6.35 mm; filter membrane: UPE.

Pressure filtration was started and the first 200 g of varnish that passed through the filter was discarded. Collection was begun with the next 30 g, and the varnish was collected in fifteen 100 mL bottles. The continuously emerging solution was collected while taking great care during collection to avoid air entrainment in the solution. The bottles used for collection were clean bottles available from Aicello Chemical Co., Ltd.

The total of 15 bottles of collected varnish were each independently stored in a 23° C., 5° C. or −20° C. environment for 0, 7, 20, 30 or 60 days, and the particle counts were measured using a liquid-borne particle counter. The varnishes that had been stored at −20° C. and 5° C. were held for at least 3 hours under 23° C. conditions prior to measurement, and were measured once the liquid temperature had reached 23° C.

The liquid-borne particle counts were measured after confirming, just prior to actual measurement, that filtered CHN measured as a blank contained not more than one particle ≥0.50 µm per 1 mL. Measurement of the liquid-borne particle counts was carried out at an air intake volume of 2 mL, a measured solution volume of 5 mL and a flow rate of 10 mL/min, and the particle count per milliliter was determined by subtracting the value for the blank measured just prior to actual measurement.

The measurement results for the liquid-borne particle counts per 1 mL in the measurement ranges ≥0.30 µm, ≥0.50 µm, ≥1.00 µm and ≥2.00 µm are shown in Tables 1 to 3. Table 1 shows the liquid-borne particle counts of the solutions when stored at 23° C., Table 2 shows the liquid-borne particle counts of the solutions when stored at 5° C., and Table 3 shows the liquid-borne particle counts of the solutions when stored at −20° C.

Comparative Example 3

Pressure filtration was carried out by the same method as in Example 11 on the HB-TmDA45V2 solution obtained in Comparative Example 2, and particle count measurements were carried out using a liquid-borne particle counter. As a result, a "Cell NG" error arose during measurement, indicating a measurement error caused by too many particles.

TABLE 1

| | \multicolumn{5}{c}{Number of days stored} |
|---|---|---|---|---|---|
| | 0 | 7 | 20 | 30 | 60 |
| 0.30 μm | 0.5 | 0.7 | 0.8 | 0.9 | 0.7 |
| 0.50 μm | 0.0 | 0.0 | 0.0 | 0.0 | 0.0 |
| 1.00 μm | 0.0 | 0.0 | 0.0 | 0.0 | 0.0 |
| 2.00 μm | 0.0 | 0.0 | 0.0 | 0.0 | 0.0 |

TABLE 2

| | \multicolumn{5}{c}{Number of days stored} |
|---|---|---|---|---|---|
| | 0 | 7 | 20 | 30 | 60 |
| 0.30 μm | 0.4 | 0.7 | 0.8 | 0.8 | 0.9 |
| 0.50 μm | 0.0 | 0.0 | 0.0 | 0.0 | 0.0 |
| 1.00 μm | 0.0 | 0.0 | 0.0 | 0.0 | 0.0 |
| 2.00 μm | 0.0 | 0.0 | 0.0 | 0.0 | 0.0 |

TABLE 3

| | \multicolumn{5}{c}{Number of days stored} |
|---|---|---|---|---|---|
| | 0 | 7 | 20 | 30 | 60 |
| 0.30 μm | 0.8 | 1.0 | 1.2 | 1.3 | 1.3 |
| 0.50 μm | 0.0 | 0.0 | 0.0 | 0.0 | 0.0 |
| 1.00 μm | 0.0 | 0.0 | 0.0 | 0.0 | 0.0 |
| 2.00 μm | 0.0 | 0.0 | 0.0 | 0.0 | 0.0 |

Comparing Example 11 with Comparative Example 3, in Comparative Example 3, measurement was not possible because there were too many particles. By contrast, in Example 11, it was found to be possible to very effectively reduce the particle count. Moreover, under the respective storage conditions at 23° C., 5° C. and −20° C., there were no marked increases in the liquid-borne particle counts, indicating that the solutions had good storage stabilities.

Example 12

A film (abbreviated below as "HB-TmDA45F1") was fabricated by using a spin coater to coat the HB-TmDA45V1 solution prepared in Example 11 onto a silicon substrate to a target thickness of about 700 nm, carrying out a 1-minute bake on a 100° C. hot plate, then carrying out a 5-minute bake out on a 200° C. hot plate, and finally carrying out a 5-minute bake on a 300° C. hot plate.

The refractive index of the HB-TmDA45F1 film was measured. The refractive index was 1.8614 at a wavelength of 400 nm, 1.7642 at a wavelength of 550 nm, and 1.7430 at a wavelength of 633 nm. The average refractive index from 400 nm to 700 nm was 1.7742.

Hence, a very high refractive index was exhibited even when a composition containing a dissolution promoter and a crosslinking agent was used.

Example 13

Figure 2:
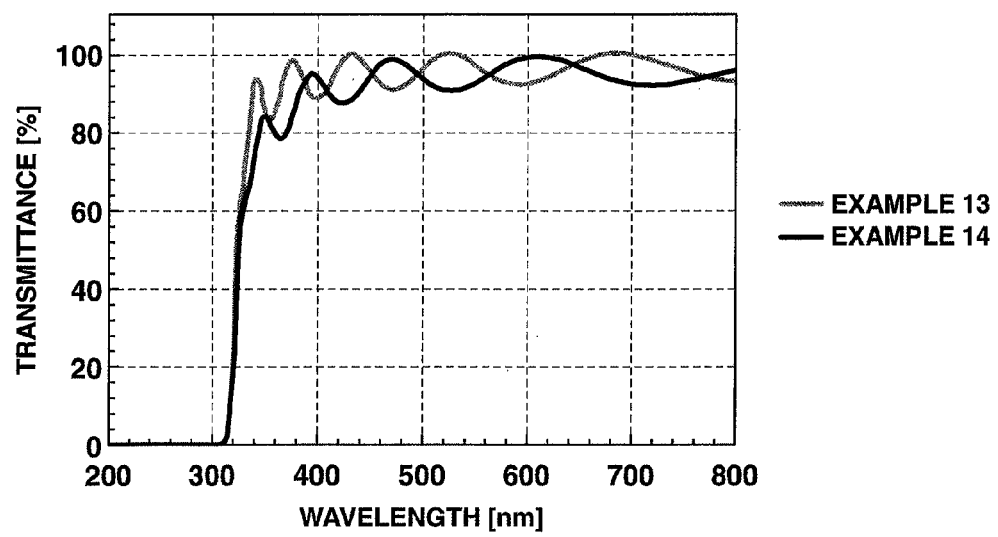
FIG. 2 is a plot showing the transmittance measurement results for the films produced in Examples 13 and 14.

A film (abbreviated below as "HB-TmDA45F2") was fabricated by using a spin coater to coat the HB-TmDA45V1 solution prepared in Example 11 onto a quartz substrate to a target thickness of about 700 nm, carrying out a 1-minute bake on a 100° C. hot plate, then carrying out a 5-minute bake out on a 200° C. hot plate. The results obtained on measuring the transmittance of the HB-TmDA45F2 film are shown in FIG. 2.

Example 14

A film (abbreviated below as "HB-TmDA45F3") was fabricated by using a spin coater to coat the HB-TmDA45V1 solution prepared in Example 11 onto a silicon substrate to a target thickness of about 700 nm, carrying out a 1-minute bake on a 100° C. hot plate, then carrying out a 5-minute bake out on a 200° C. hot plate, and finally carrying out a 5-minute bake on a 300° C. hot plate. The results obtained on measuring the transmittance of the HB-TmDA45F3 film are also shown in FIG. 2.

Marked decreases did not occur in the transmittance of the film after a 5-minute bake at 200° C. and in the transmittance of the film after a 5-minute bake at 200° C. and a 5-minute bake at 300° C. This demonstrated that the film had a very highly heat-resistant transmittance.

Example 15

A solvent resistance test was carried out on the HB-TmDA45F1 film obtained in Example 12. The HB-TmDA45F1 film had a thickness of 687.9 nm; this value was treated as the initial film thickness. Separate HB-TmDA45F1 films were each independently immersed completely in propylene glycol monomethyl ether, propylene glycol monomethyl ether acetate, cyclohexanone, acetone or ethyl lactate, and left to stand 5 minutes. Next, the films were dried in air, after which the residual solvent was completely evaporated by a 1-minute bake on a 200° C. hot plate. The film thickness was then measured and compared with the initial film thickness.

Letting the initial thickness of the film be 100%, the film thicknesses following immersion in the respective solvents were 100.0% for propylene glycol monomethyl ether, 100.0% for propylene glycol monomethyl ether acetate, 100.0% for cyclohexanone, 100.0% for acetone, and 100.0% for ethyl lactate. Hence, the film was found to have good solvent resistances to various types of organic solvents.

The solvent resistance test refers to a test which shows that the film obtained after the main bake is insoluble when brought into contact with a solvent. Solvent resistance is a property that is essential when the subsequent steps of recoating the film with a resist or the like and patterning are carried out. In the absence of solvent resistance, the film dissolves in the resist solution during recoating, leading to mixture of the film and the resist, as a result of which the inherent properties of the film may be exhibited.

Example 16

A gap-filling performance test was carried out using the HB-TmDA45V1 solution prepared in Example 11. The microstructure substrate used in the gap-filling performance test was made of silicon, had a thickness of 1.6 μm, and the diameter of the vias was 400 nm.

The HB-TmDA45V1 solution was applied onto the microstructure substrate by spin-coating to a target thickness of about 700 nm, carrying out a 1-minute pre-bake on a 100° C. hot plate, then carrying out a 5-minute bake on a 200° C. hot plate in the open air, and finally carrying out a 5-minute main bake on a 300° C. hot plate.

A diamond pen was used to apply a mark to the end of the microstructure substrate having a baked film thereon, following which the substrate was cleaved and examined with a scanning electron microscope (SEM). The SEM image is shown in FIG. 3.

Figure 3:
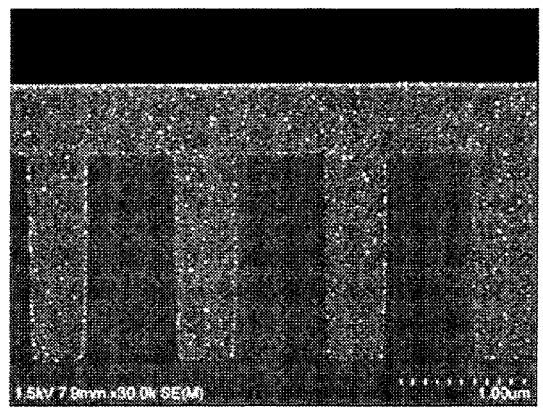
FIG. 3 is a scanning electron micrograph showing a region of 400 nm vias in the gap-filling performance test in Example 16.

As shown in FIG. 3, the gap-filling performance was good, implying that it may be possible to use the composition as an embedding material.

In cases where the highly branched polymer of the invention is used as a planarizing material on a photodiode, because the refractive index is at least 1.7, which is high, light can be guided to the photodiode by the optical waveguide principle. As a result, the via diameter can be set to a smaller diameter than at present, making it possible to fabricate highly sensitive solid-state image sensors.

As explained above, the inventive compositions containing a hyperbranched polymer and a dissolution promoter have an excellent storage stability as a varnish, exhibit an excellent transparency and heat resistance and also have a high refractive index when formed into a film, and moreover have an excellent solubility in various solvents. As a result, such compositions can be employed in, for example, protective films for liquid-crystal display devices, TFT array planarizing films, overcoats and spacer materials for color filters and the like, light extraction enhancing films for EL displays, light capture-increasing films for image sensors, and light extraction-enhancing layers in light-emitting diodes.

The invention claimed is:
1. A film-forming composition comprising
a triazine ring-containing hyperbranched polymer which includes a recurring unit structure of formula (1) below

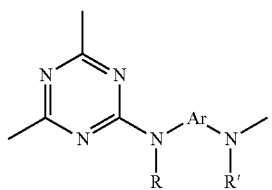
(1)

wherein
R and R' are each independently a hydrogen atom, an alkyl group, an alkoxy group, an aryl group or an aralkyl group, with the proviso that at least one of R and R' is a hydrogen atom; and
Ar is a divalent organic group which is at least one member selected from the group consisting of formulas (5) to (12) and (14) to (18) below

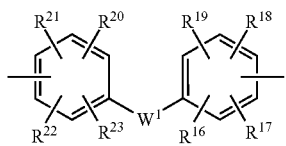
(5)

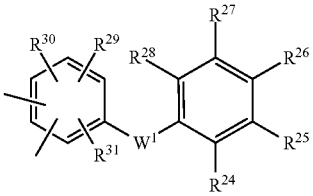
(6)

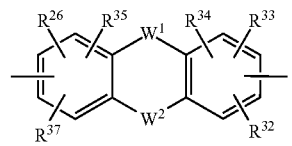
(7)

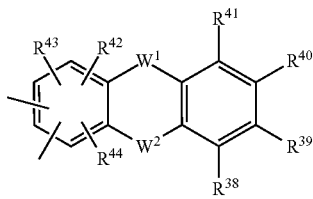
(8)

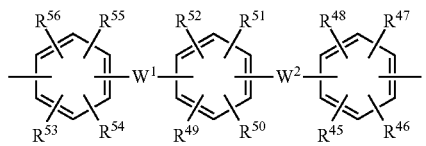
(9)

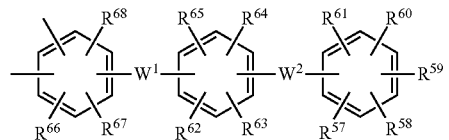
(10)

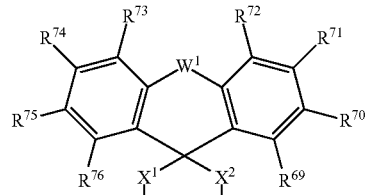
(11)

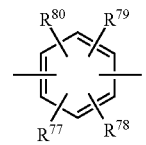
(12)

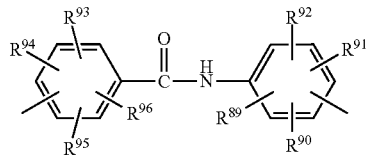
(14)

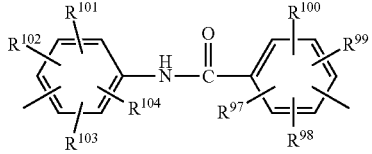
(15)

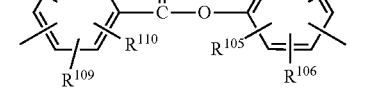
(16)

-continued

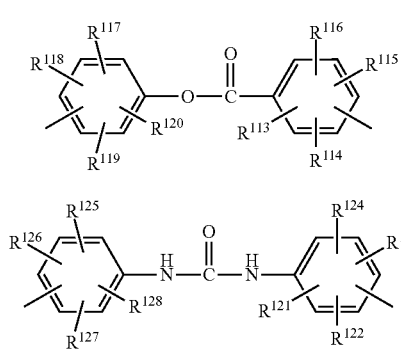
(17)

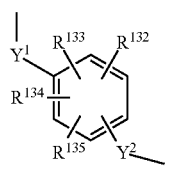
(18)

wherein
- $R^{16}$-$R^{80}$ and $R^{89}$-$R^{128}$ are each independently a hydrogen atom, a halogen atom, a carboxyl group, a sulfonyl group, an alkyl group which may have a branched structure of 1 to 10 carbons, or an alkoxy group which may have a branched structure of 1 to 10 carbons;
- $W^1$ and $W^2$ are each independently a single bond, $CR^{129}R^{130}$, with $R^{129}$ and $R^{130}$ being each independently a hydrogen atom or an alkyl group which may have a branched structure of 1 to 10 carbons, with the proviso that $R^{129}$ and $R^{130}$ may together form a ring, $C{=}O$, $O$, $S$, $SO$, $SO_2$ or $NR^{131}$ ($R^{131}$ being a hydrogen atom or an alkyl group which may have a branched structure of 1 to 10 carbons); and
- $X^1$ and $X^2$ are each independently a single bond, an alkylene group which may have a branched structure of 1 to 10 carbons, or a group of formula (19) below

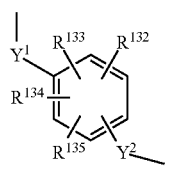
(19)

$R^{132}$ to $R^{135}$ being each independently a hydrogen atom, a halogen atom, a carboxyl group, a sulfonyl group, an alkyl group which may have a branched structure of 1 to 10 carbons, or an alkoxy group which may have a branched structure of 1 to 10 carbons; and $Y^1$ and $Y^2$ being each independently a single bond or an alkylene group which may have a branched structure of 1 to 10 carbons, an organic solvent, and at least a dissolution promoter which breaks hydrogen bonds that have formed, within and/or between molecules of the hyperbranched polymer, between nitrogen atoms on the triazine ring and NH groups from a diarylamine, wherein said film-forming composition contains from 0.01 to 50 parts by weight of said dissolution promoter per 100 parts by weight of said triazine ring-containing hyperbranched polymer.

2. The film-forming composition according to claim 1, wherein Ar is at least one selected from the group consisting of formulas (20) to (22) below

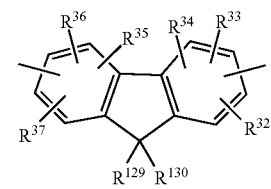
(20)

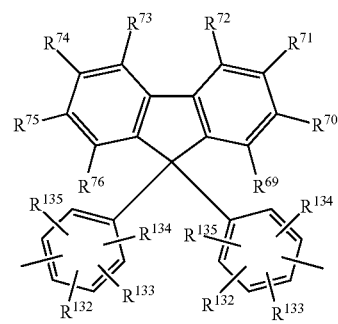
(21)

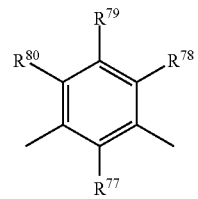
(22)

$R^{32}$ to $R^{37}$, $R^{69}$ to $R^{80}$, $R^{129}$, $R^{130}$ and $R^{132}$ to $R^{135}$ being as defined above.

3. The film-forming composition according to claim 1, wherein the recurring unit structure has formula (23) below

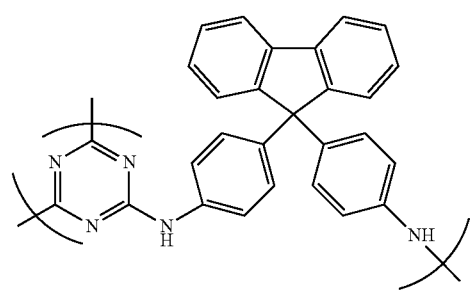
(23)

4. The film-forming composition according to claim 1, wherein the recurring unit structure has formula (24) below

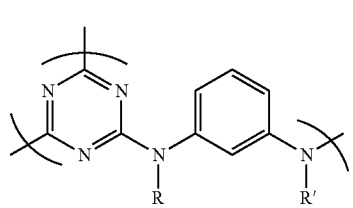
(24)

R and R' being as defined above.

5. The film-forming composition according to claim 4, wherein the recurring unit structure has formula (25) below

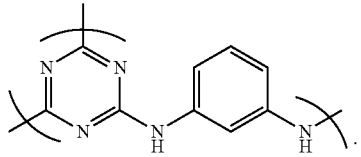
(25)

6. The film-foaming composition according to claim 1, wherein the triazine ring-containing hyperbranched polymer is capped on at least one end by an alkyl, aralkyl, aryl, alkylamino, alkoxysilyl-containing alkylamino, aralkylamino, arylamino, alkoxy, aralkyloxy, aryloxy or ester group.

7. The film-forming composition according to claim 6, wherein the triazine ring-containing hyperbranched polymer has at least one terminal triazine ring, which terminal triazine ring is capped by an alkyl, aralkyl, aryl, alkylamino, alkoxysilyl-containing-alkylamino, aralkylamino, arylamino, alkoxy, aralkyloxy, aryloxy, or ester group.

8. A film-forming composition comprising
a triazine ring-containing hyperbranched polymer which includes a recurring unit structure of formula (1) below

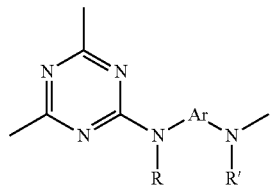
(1)

wherein R and R' are each independently a hydrogen atom, an alkyl group, an alkoxy group, an aryl group or an aralkyl group, with the proviso that at least one of R and R' is a hydrogen atom; and Ar is a divalent organic group which includes one or both of an aromatic ring and a heterocycle,
an organic solvent, and
at least a dissolution promoter which breaks hydrogen bonds that have formed, within and/or between molecules of the hyperbranched polymer, between nitrogen atoms on the triazine ring and NH groups from a diarylamine,
wherein said film-forming composition contains from 0.01 to 50 parts by weight of said dissolution promoter per 100 parts by weight of said triazine ring-containing hyperbranched polymer,
wherein the dissolution promoter is water, an acid, a base, or a compound which includes one or more moieties selected from the group consisting of hydroxyl groups, carbonyl groups, carboxyl groups, amino groups, amide groups, urethane bonds, and urea bonds.

9. The film-forming composition according to claim 8, wherein the dissolution promoter is water.

10. The film-forming composition according to claim 8, wherein the dissolution promoter is an acid.

11. The film-forming composition according to claim 8, wherein the dissolution promoter is a base.

12. A film obtained from a film-forming composition comprising
a triazine ring-containing hyperbranched polymer which includes a recurring unit structure of formula (1) below (1)

wherein R and R' are each independently a hydrogen atom, an alkyl group, an alkoxy group, an aryl group or an aralkyl group, with the proviso that at least one of R and R' is a hydrogen atom; and Ar is a divalent organic group which includes one or both of an aromatic ring and a heterocycle,
an organic solvent, and
at least a dissolution promoter which breaks hydrogen bonds that have formed, within and/or between molecules of the hyperbranched polymer, between nitrogen atoms on the triazine ring and NH groups from a diarylamine,
wherein said film-forming composition contains from 0.01 to 50 parts by weight of said dissolution promoter per 100 parts by weight of said triazine ring-containing hyperbranched polymer.

13. An electronic device comprising a base material and the film of claim 12 formed on the base material.

14. An optical member comprising a base material and the film of claim 12 formed on the base material.

15. A solid-state image sensor formed of a charge-coupled device or a complementary metal oxide semiconductor, the sensor comprising at least one layer of the film of claim 12.

16. A solid-state image sensor comprising, as a planarization layer on a color filter, the film of claim 12.

17. A lens material, planarizing material or embedding material for a solid-state image sensor, the material being comprised of the film-forming composition of claim 1.

18. The film-forming composition according to claim 8, wherein the dissolution promoter is a compound which includes one or more moieties selected from the group consisting of hydroxyl groups, carboxyl groups, and amino groups.

19. The film-forming composition according to claim 1, wherein the organic solvent is one or more selected from the group consisting of toluene, p-xylene, o-xylene, m-xylene, ethylbenzene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-methoxy-2-propanol, tetrahydrofuran, 1,4-dioxane, N,N-dimethylformamide, N-methylpyrrolidone, 1,3-dimethyl-2-imidazolidinone, dimethylsulfoxide, and N-cyclohexyl-2-pyrrolidinone.

\* \* \* \* \*